(12) United States Patent
Lu et al.

(10) Patent No.: US 11,832,429 B2
(45) Date of Patent: Nov. 28, 2023

(54) EIGHT-TRANSISTOR STATIC RANDOM ACCESS MEMORY, LAYOUT THEREOF, AND METHOD FOR MANUFACTURING THE SAME

(71) Applicant: TAIWAN SEMICONDUCTOR MANUFACTURING CO., LTD., Hsinchu (TW)

(72) Inventors: Shau-Wei Lu, Taoyuan (TW); Hao Chang, Taipei (TW); Kun-Hsi Li, Hsinchu (TW); Kuo-Hung Lo, Hsinchu (TW); Kang-Yu Hsu, New Taipei (TW); Yao-Chung Hu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 402 days.

(21) Appl. No.: 17/129,850

(22) Filed: Dec. 21, 2020

(65) Prior Publication Data
US 2021/0183870 A1    Jun. 17, 2021

Related U.S. Application Data

(63) Continuation of application No. 16/588,828, filed on Sep. 30, 2019, now Pat. No. 10,872,896, which is a (Continued)

(51) Int. Cl.
*H10B 10/00*    (2023.01)
*H01L 27/092*   (2006.01)
(Continued)

(52) U.S. Cl.
CPC ..... *H10B 10/12* (2023.02); *H01L 21/823807* (2013.01); *H01L 21/823821* (2013.01);
(Continued)

(58) Field of Classification Search
CPC ............. H01L 21/823842; H01L 29/36; H01L 29/1037; H01L 27/0922; H01L 27/0207;
(Continued)

(56) References Cited

U.S. PATENT DOCUMENTS 4,876,215 A * 10/1989 Hsu .................. H01L 21/74
                                          257/E27.101
6,710,412 B2 * 3/2004 Tsukamoto ........... G11C 11/412
                                          257/E27.098
(Continued)

FOREIGN PATENT DOCUMENTS

| CN | 103106917 A | 5/2013 |
| TW | 201432681 A | 8/2014 |
| WO | 2014/080184 A1 | 5/2014 |

OTHER PUBLICATIONS

Notice of Allowance issued in related U.S. Appl. No. 15/940,230, dated Aug. 28, 2019.
(Continued)

*Primary Examiner* — Changhyun Yi
(74) *Attorney, Agent, or Firm* — Studebaker & Brackett PC

(57) ABSTRACT

A Static Random Access Memory (SRAM) cell includes a write port including a first inverter including a first pull-up transistor and a first pull-down transistor, and a second inverter including a second pull-up transistor and a second pull-down transistor and cross-coupled with the first inverter; and a read port including a read pass-gate transistor and a read pull-down transistor serially connected to each. A first doped concentration of impurities doped in channel regions of the second pull-down transistor and the read pull-down transistor is greater than a second doped concentration of the impurities doped in a channel region of the first pull-down transistor, or the impurities are doped in the channel regions of the second pull-down transistor and the (Continued)

read pull-down transistor and are not doped in the channel region of the first pull-down transistor.

20 Claims, 25 Drawing Sheets

Related U.S. Application Data continuation of application No. 15/940,230, filed on Mar. 29, 2018, now Pat. No. 10,483,267.

(60) Provisional application No. 62/527,742, filed on Jun. 30, 2017.

(51) Int. Cl.
| | | |
|---|---|---|
| *H01L 29/10* | (2006.01) | |
| *H01L 21/8238* | (2006.01) | |
| *H01L 29/66* | (2006.01) | |
| *H01L 29/08* | (2006.01) | |
| *H01L 29/36* | (2006.01) | |
| *H01L 27/02* | (2006.01) | |
| *H01L 21/3105* | (2006.01) | |
| *H01L 29/49* | (2006.01) | |
| *H01L 21/027* | (2006.01) | |

(52) U.S. Cl.
CPC ........... *H01L 21/823842* (2013.01); *H01L 21/823871* (2013.01); *H01L 27/0207* (2013.01); *H01L 27/0922* (2013.01); *H01L 27/0924* (2013.01); *H01L 29/0847* (2013.01); *H01L 29/1037* (2013.01); *H01L 29/36* (2013.01); *H01L 29/6656* (2013.01); *H01L 29/66636* (2013.01); *H01L 21/0276* (2013.01); *H01L 21/31053* (2013.01); *H01L 29/4966* (2013.01); *H01L 29/66545* (2013.01)

(58) Field of Classification Search
CPC ......... H01L 21/823821; H01L 29/6656; H01L 29/0847; H01L 21/823807; H01L 21/823871; H01L 27/0924; H01L 29/66636; H01L 29/66545; H01L 21/31053; H01L 21/0276; H01L 29/4966; H01L 27/0727; H01B 10/12
USPC ....................................................... 257/369
See application file for complete search history.

(56) References Cited

U.S. PATENT DOCUMENTS

| | | | |
|---|---|---|---|
| 7,404,154 | B1 | 7/2008 | Venkatraman et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 10,050,045 | B1 | 8/2018 | Hsu et al. |
| 10,483,267 | B2 | 11/2019 | Lu et al. |
| 10,872,896 | B2 * | 12/2020 | Lu ..................... H01L 29/6656 |
| 2004/0245577 | A1 | 12/2004 | Bhattacharyya |
| 2010/0259971 | A1 | 10/2010 | Liaw |
| 2011/0063894 | A1 | 3/2011 | Lee et al. |
| 2013/0003445 | A1 | 1/2013 | Lee et al. |
| 2013/0341723 | A1 | 12/2013 | Mojumder et al. |
| 2014/0078817 | A1 | 3/2014 | Bentum et al. |
| 2016/0064068 | A1 | 3/2016 | Mojumder et al. |
| 2016/0254045 | A1 | 9/2016 | Mazumder et al. |
| 2017/0338233 | A1 | 11/2017 | Huang et al. |
| 2018/0138185 | A1 | 5/2018 | Hsu et al. |
| 2018/0151553 | A1 | 5/2018 | Liaw |
| 2018/0151574 | A1 | 5/2018 | Li |
| 2018/0301551 | A1 | 10/2018 | Majhi et al. |
| 2019/0027211 | A1 | 1/2019 | Morris et al. |

OTHER PUBLICATIONS

Non-Final Office Action issued in related U.S. Appl. No. 15/940,230, dated Mar. 19, 2019.
Non-Final Office Action issued in U.S. Appl. No. 16/588,828, dated Jun. 15, 2020.
Notice of Allowance issued in U.S. Appl. No. 16/588,828, dated Sep. 22, 2020.

* cited by examiner

US 11,832,429 B2

EIGHT-TRANSISTOR STATIC RANDOM ACCESS MEMORY, LAYOUT THEREOF, AND METHOD FOR MANUFACTURING THE SAME

PRIORITY CLAIM AND CROSS-REFERENCE

This application is a continuation application of U.S. patent application Ser. No. 16/588,828, filed Sep. 30, 2019, now U.S. Pat. No. 10,872,896, which is a continuation application of U.S. patent application Ser. No. 15/940,230, filed Mar. 29, 2018, now U.S. Pat. No. 10,483,267, which claims priority to U.S. Provisional Application No. 62/527,742 filed Jun. 30, 2017, the entire disclosures of each of which are incorporated herein by reference.

TECHNICAL FIELD

Embodiments of the present disclosure are related to an eight-transistor static random access memory (SRAM), a layout thereof, and a method for manufacturing the same.

BACKGROUND

An eight-transistor SRAM includes a write-port portion and a read-port portion and has unbalanced gate electrode layers with respect to a center of a write-portion, as one of the gate electrodes extends from the write-port portion to the read-port portion and another of the gate electrodes does not extend to a portion corresponding to the read-port portion. Thus, SRAM performance can be deteriorated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
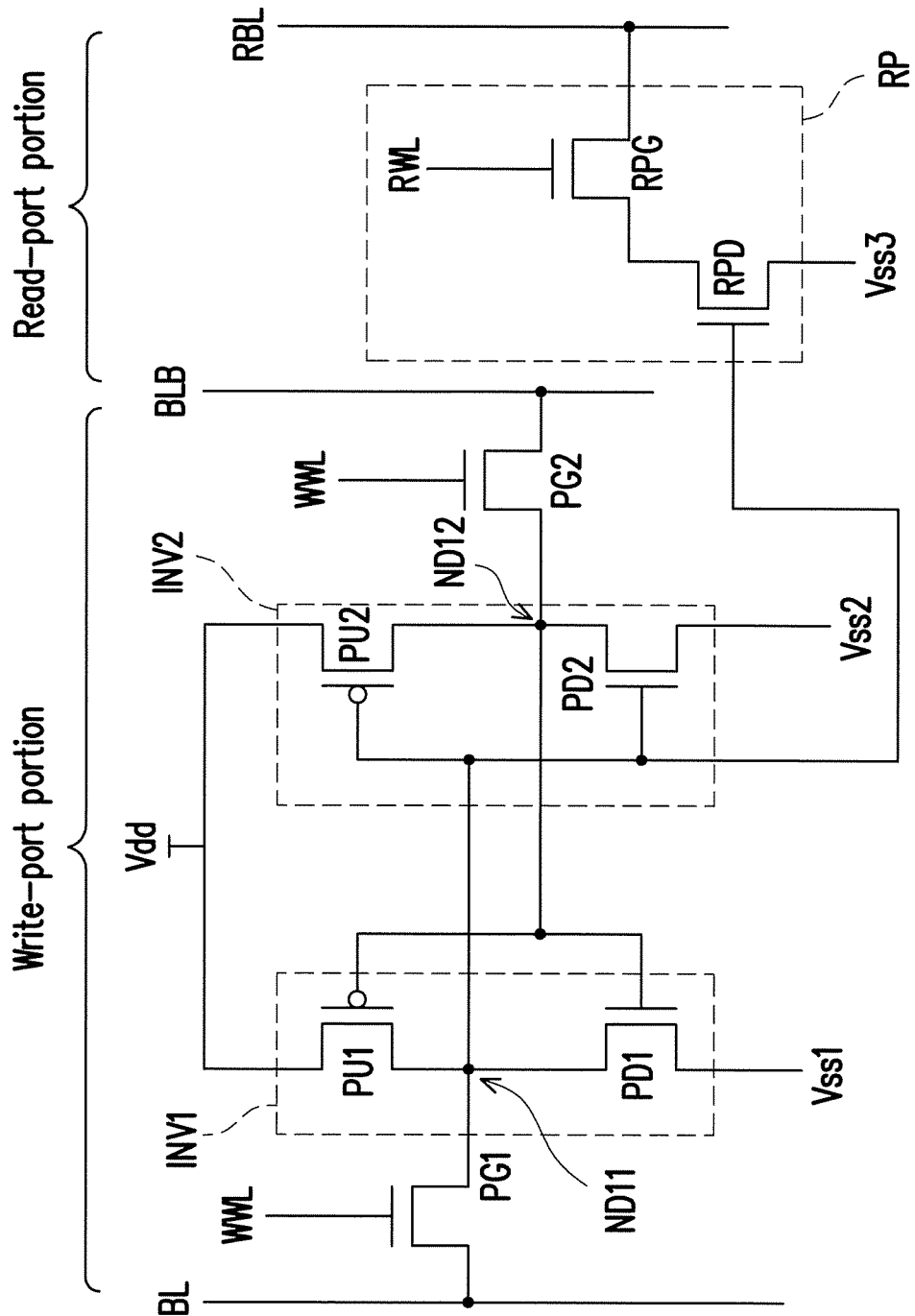
FIG. 1 illustrates an exemplary circuit diagram of an 8-transistor (8-T) static random access memory (SRAM) cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the present disclosure, a layer, a pattern, a line such as a bit line, a word line, and a power supply line, or a structure extending in one direction means that a dimension of the layer, the pattern, the line, or the structure in the extended one direction is greater than another dimension thereof in another direction perpendicular to the extended one direction, with, or without, consideration of process errors/variations occurred during manufacturing. In the present disclosure, unless described explicitly, extending a layer, a pattern, a line, or a structure means unidirectionally extending a layer, a pattern, a line (including a bit line or a word line), with, or without, consideration of process errors/variations in manufacturing. That is, unless described explicitly, extending a layer, a pattern, a line, or a structure means forming a layer, a pattern, a line, or a structure having the same width with, or without, consideration of process errors/variations. It should be understood that in the present disclosure, one pattern (or one direction) being perpendicular or substantially perpendicular to another pattern (or another direction) means that the two patterns (or two directions) are perpendicular to each other or the two patterns (or two directions) are perpendicular to each other with, or without, consideration of errors/variations in manufacturing process. It should be understood that in the present disclosure, one pattern (or one direction) being parallel or substantially parallel to another pattern (or another direction) means that the two patterns (or two directions) are parallel to each other or the two patterns (or two directions) are parallel to each other with, or without, consideration of margins or errors/variations in manufacturing process. It should be understood that in the present disclosure, one pattern/structure being symmetric to another pattern/structure with respect to a reference pattern/structure means that the two patterns/structures are symmetric to each other with respect to the reference pattern/structure or the two patterns/structures are symmetric to each other with, or without, consideration of margins or errors/variations in manufacturing process, with respect to the reference pattern/structure.

In the present disclosure, "about," "approximately," or "substantial" used to describe a parameter means that design error/margin, manufacturing error/margin, measurement error etc. are considered to define the parameter, or means that the described parameter has the exact value or range without using "about," "approximately," or "substantial." Such a description should be recognizable to one of ordinary skill in the art.

In the present disclosure, it should be appreciated that a respective layer of a memory cell that touches or crosses a boundary thereof is continuously formed when another memory cell is disposed immediately adjacent to the memory cell along the common boundary thereof. In other words, the respective layer of the memory cell and another layer of the adjacent memory cell corresponding to the respective layer form a single continuous layer.

Embodiments of the present disclosure are considered to be able to be implemented by being combined in whole or in part one with another. For example, one element described in a particular embodiment, even if it is not described in another embodiment, can be understood as a description related to the other embodiment, unless an opposite or contradictory description is explicitly provided.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 illustrates an exemplary circuit diagram of an 8-transistor (8-T) static random access memory (SRAM) cell 10. The SRAM cell 10 includes a write-port portion having cross-coupled first and second inverters INV1 and INV2 and first and second pass-gate transistors PG1 and PG2, and a read-port portion including a read pass-gate transistor RPG and a read-pull-down transistor RPD.

Source electrodes of the pass-gate transistors PG1 and PG2 are respectively coupled to a first bit line BL and a second bit line BLB carrying data complementary to that carried by the first bit line BL, and gate electrodes of the pass-gate transistors PG1 and PG2 are coupled to a write word line WWL. A drain electrode of the first pass-gate transistor PG1, an output of the first invertor INV1, and an input of the second invertor INV2 are coupled to each other at a first local connection electrode ND11. A drain electrode of the second pass-gate transistor PG2, an input of the first invertor INV1, and an output of the second invertor INV2 are coupled to each other at a second local connection electrode ND12. The cross-coupled first and second inverters INV1 and INV2 function as a latch that stores a value and its complement. The cross-coupled invertors INV1 and INV2 are implemented by a first pull-up transistor PU1 and a first pull-down transistor PD1, and by a second pull-up transistor PU2 and a second pull-down transistor PD2, respectively. Drain electrodes of the first pull-up transistor PU1, the first pass-gate transistor PG1, and the first pull-down transistor PD1 are connected to each other at the first local connection electrode ND11. Drain electrodes of the second pull-up transistor PU2, the second pass-gate transistor PG2, and the second pull-down transistor PD2 are connected to each other at the second local connection electrode ND12.

Source electrodes of the first and second pull-down transistors PD1 and PD2 are connected to first and second power supply lines Vss1 and Vss2, respectively. Source electrodes of the first and second pull-up transistors PU1 and PU2 are connected to a power supply line Vdd.

The gate electrodes of the second pull-up transistor PU2 and the second pull-down transistor PD2, the drain electrodes of the first pass-gate transistor PG1, the first pull-up transistor PU1, and the first pull-down transistor PD1, are electrically connected to a gate electrode of the read pull-down transistor RPD. A source electrode of the read pull-down transistor RPD is electrically connected to a third power supply line Vss3 and a drain electrode thereof is electrically connected to a drain electrode of the read pass-gate transistor RPG. Although not shown in the drawings, the first, second, and third power supply lines Vss1, Vss2, and Vss3 can be electrically connected to each other so as to have the same potential. A gate electrode of the read pass-gate transistor RPG is electrically connected to a read word line RWL and a source electrode thereof is electrically connected to a read bit line RBL.

Figure 2:
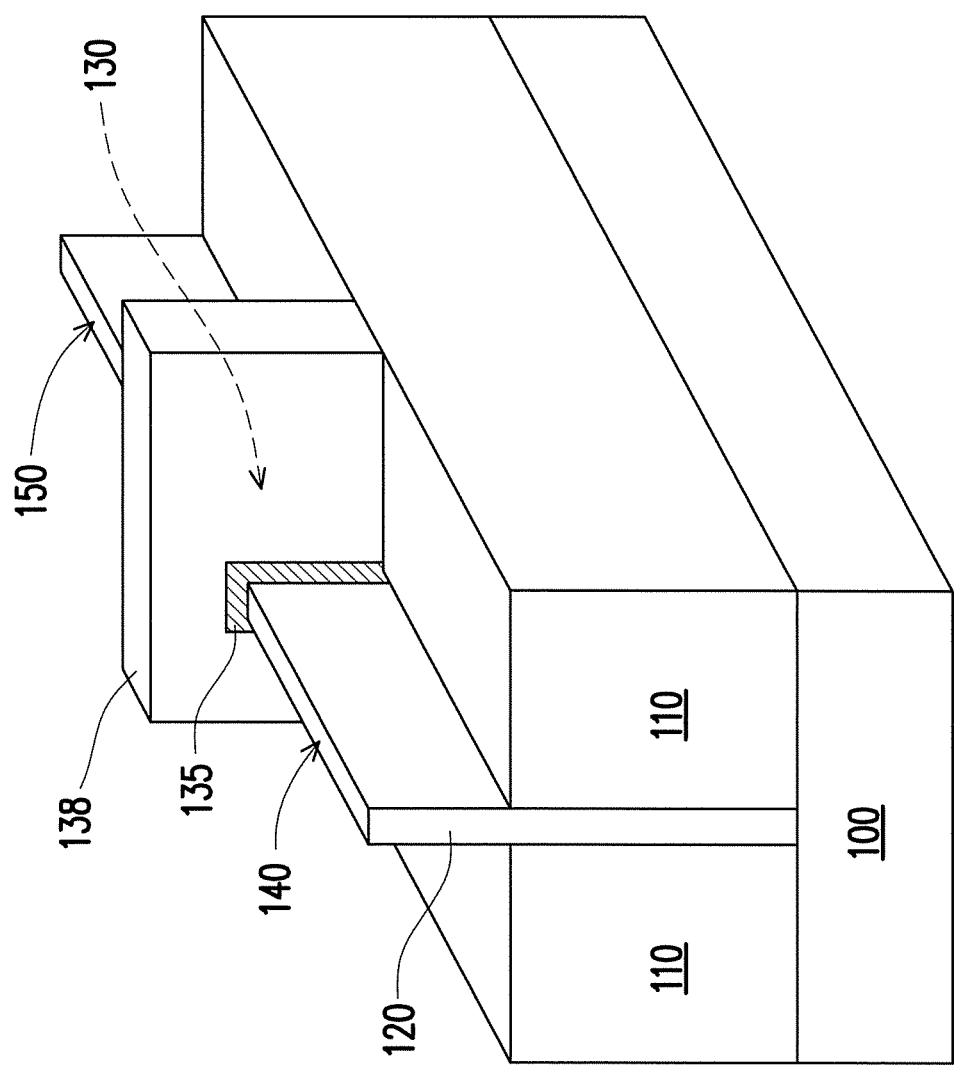
FIG. 2 is a perspective view of a fin field-effect transistor (FinFET) relating to an embodiment of the present disclosure.

FIG. 2 is an exemplary perspective view of a fin field-effect transistor (FinFET) relating to an embodiment of the present disclosure, which can be employed to implement the SRAM cell shown in FIG. 1.

Referring to FIG. 2, a FinFET 15 includes a semiconductor fin 120 formed, for example, of silicon, protruding from a substrate 100 such as a silicon substrate. The semiconductor fin 120 can be a trench-etched substrate or grown by epitaxy. Alternatively, the semiconductor fin 120 can be made of a device layer of a silicon-on-insulator (SOI) substrate. A lower portion of the semiconductor fin 120 is interposed between isolation regions 110 formed over the substrate 100. The isolation regions 110 are shallow trench isolation (STI) regions as an example to be described next. The present disclosure, however, is not limited thereto. The isolation regions 110 can be field oxide regions, according to another embodiment.

The FinFET 15 further includes a source region 140 and a drain region 150 and a channel region 130 interposed therebetween. The source region 140, the drain region 150, and the channel region 130 of the FinFET 15 are made of a top portion of the semiconductor fin 120 at a level above the isolation regions 110. The source and drain regions 140 and 150 are heavily doped and may contain impurities having a concentration in a range from about $5 \times 10^{19}$ cm$^{-3}$ to $1 \times 10^{20}$ cm$^{-3}$, while the channel region 130 is undoped or lightly doped.

In some embodiments, the channel region 130 can be lightly doped with impurities having a type the same as pre-doped impurities such that a threshold voltage of the FinFET 15 can be increased as compared to an example without such a doping. Here, the increase in the threshold voltage refers to an increase in the absolute values of the threshold voltage of the FinFET 15. Such a doping process refers to a counter doping process to be described later.

A gate electrode layer 138 is made of one or more layers of metallic material, such as W, or Co, and may further include other work function adjusting metals, is formed over the channel region 130, and extends to cover sidewalls of the channel region 130 and to cover portions of the isolation regions 110.

One of ordinary skill in the art should appreciate that if the configuration of the FinFET 15 is used as an N-type transistor to implement, for example, the pass-gate transistors and the pull-down transistors in the SRAM cell 10 and if the configuration of the FinFET 15 is used as a P-type transistor to implement, for example, the pull-up transistors in the SRAM cell 10, materials for forming the gate electrode layers or thicknesses of corresponding portions of the gate electrode layers of the N-type transistors and the P-type transistors can be different, so as to obtain suitable work function levels for the N-type transistors and the P-type transistors, respectively, thereby having suitable threshold voltages according to design particulars. Such features will be more apparent with respect to FIGS. 5, 20, and 22 to be described later.

The FinFET 15 also has a gate insulating layer 135 formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixture thereof. The gate insulating layer 135 is interposed between the gate electrode layer 138 and the channel region 130 to electrically isolate them from each other.

Although not shown in FIG. 2, according to some embodiments, two or more FinFETs may be formed primarily based on the same semiconductor fin 120. In this case, source and drain regions and channel regions of the two or more FinFETs may be formed by the same semiconductor fin 120. Thus, the drain regions (or the source regions), which are disposed between the channel regions of two immediately adjacent FinFETs, are directly coupled to each other.

It should be appreciated that metal contacts can be formed over the source and drain regions 140 and 150, and/or a gate layer contact can be formed over the gate electrode layer 138, to electrically connect the source and drain regions 140 and 150, and/or the gate electrode layer 138 to various metal layers such as bitlines, wordlines, and power supply nodes over the FinFET 15.

According to other embodiments, the source and drain regions of the FinFET 15 can be made of an in-situ heavily doped epitaxy layer filling recesses formed by removing upper portions of the regions represented by reference numerals 140 and 150, rather than directly formed of the semiconductor fin 120 as shown in FIG. 2. In some embodiments, the epitaxy layer for forming the source and drain regions can be heavily doped after an epitaxy process.

Figure 3A:
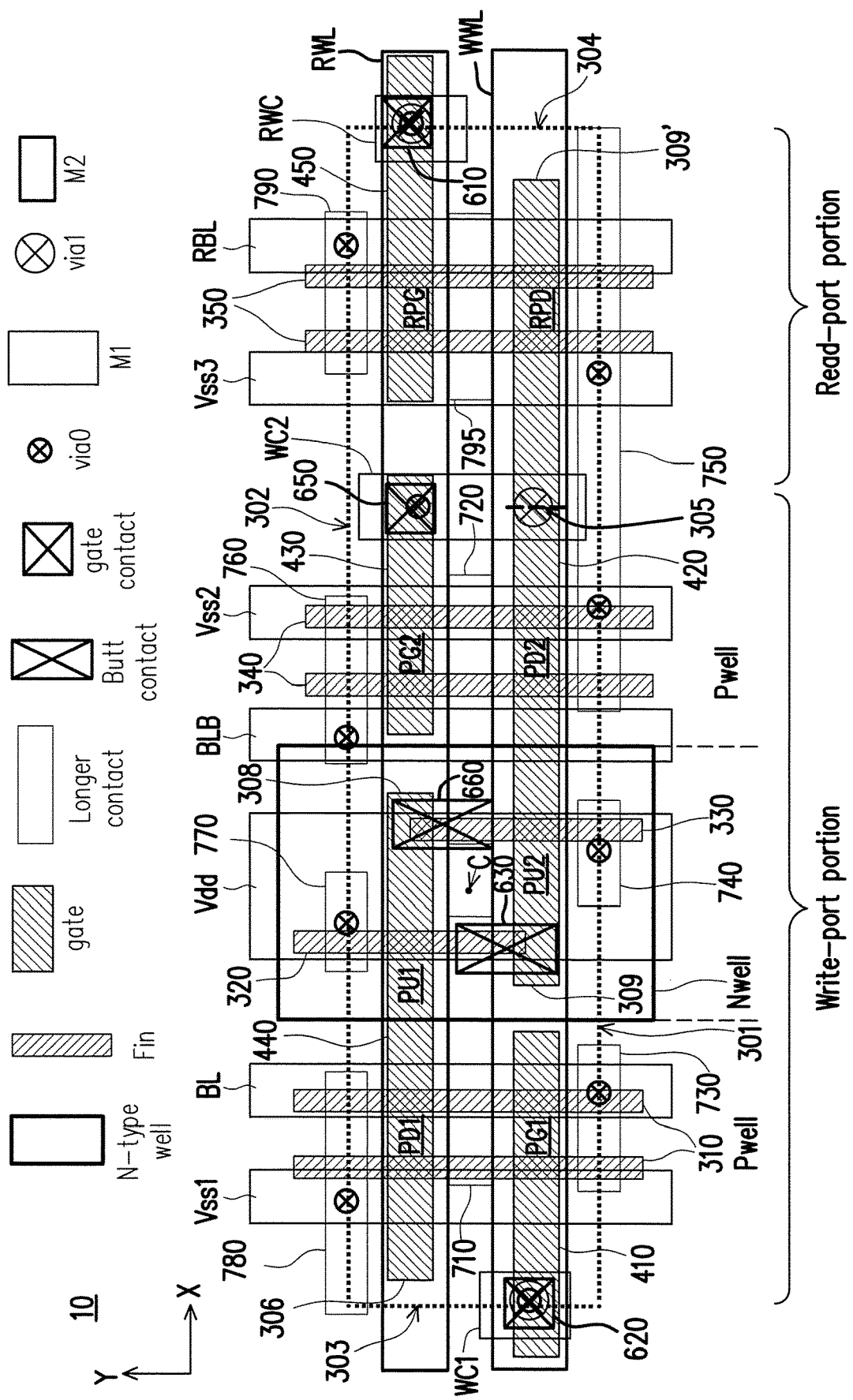
FIG. 3A illustrates a simplified layout of the 8T SRAM cell, of which the circuit diagram is shown in FIG. 1.

FIG. 3A illustrates a simplified layout of the 8-T SRAM cell, of which the circuit diagram is shown in FIG. 1. For convenience of illustration, the simplified layout shown in FIG. 3A only illustrates a layout of wells, semiconductor fins, gate electrode layers/gate electrodes, contacts formed on the semiconductor fins, gate contacts formed on the gate electrode layers/gate electrodes, vias (via0 and vias1), a first metal layer, and a second metal layer. One of ordinary skill in the art should understand that one or more metal layers can be formed at a level above the second metal layer and be electrically connected to conductive patterns therebelow through vias therebetween. One of ordinary skill in the art should also understand that for the purpose of illustration, FIG. 3A only shows one exemplary configuration of the metal layers including the first and second metal layers. The present disclosure should not be limited thereto.

Figure 3B:
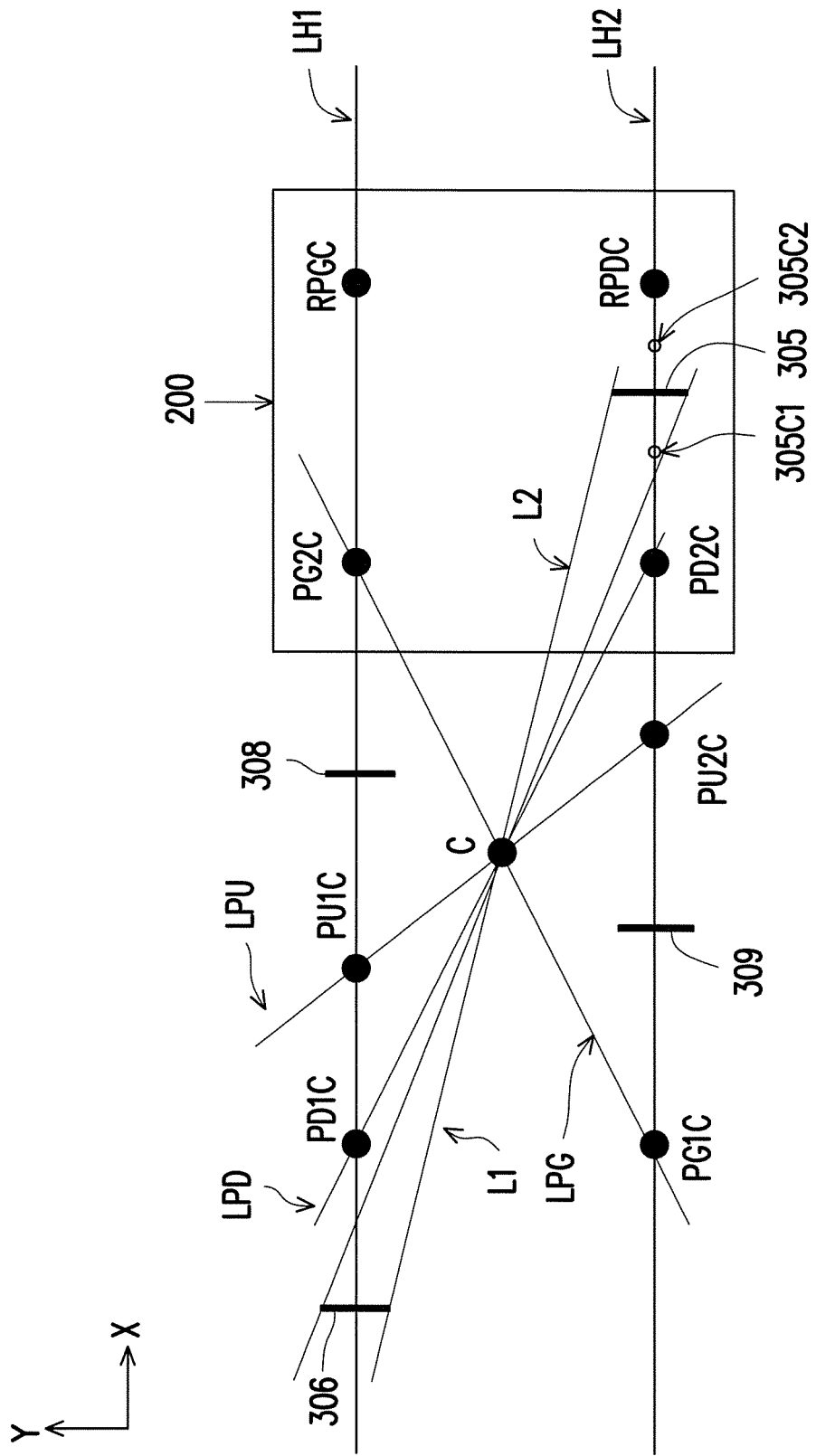
FIG. 3B illustrates relative locations of a metal junction in a second gate electrode and an end of the fourth gate electrode with respect to geometric centers of the transistors of the write-port portion of the SRAM cell shown in FIG. 3A.

FIG. 3B illustrates relative locations of a metal junction in a second gate electrode and an end of the fourth gate electrode with respect to geometric centers of the transistors of the write-port portion of the SRAM cell shown in FIG. 3A.

Figure 4:
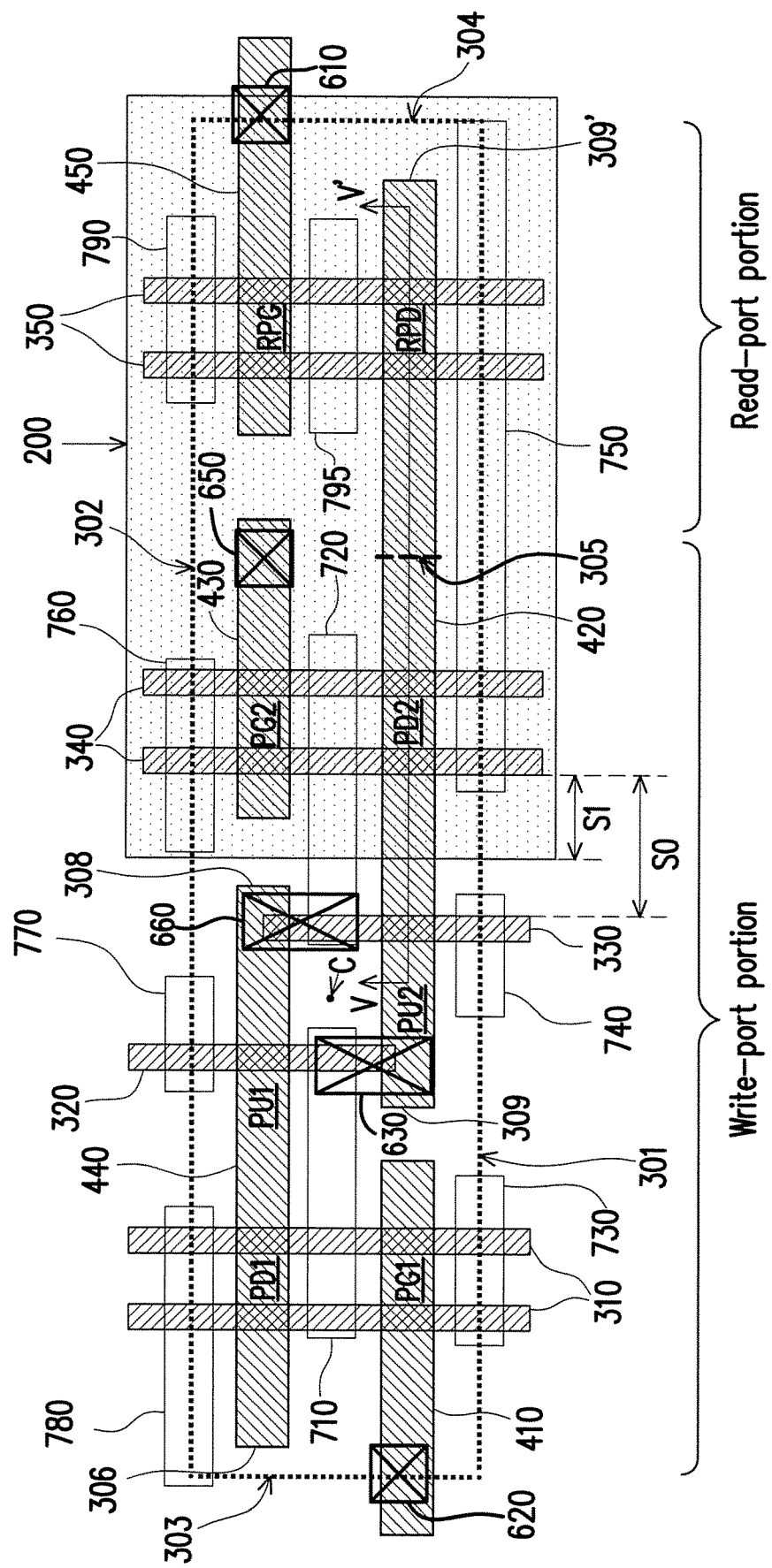
FIG. 4 illustrates a simplified layout of the SRAM cell shown in FIG. 3A.

FIG. 4 illustrates a simplified layout of the SRAM cell shown in FIG. 3A. For convenience, a layout of semiconductor fins, gate electrode layers/gate electrodes, longer contacts, butt contacts, and gate contacts, is illustrated in FIG. 4, while a layout of other layer such as the first metal layer M1, the second metal layer M2, and the vias is omitted.

Figure 5:
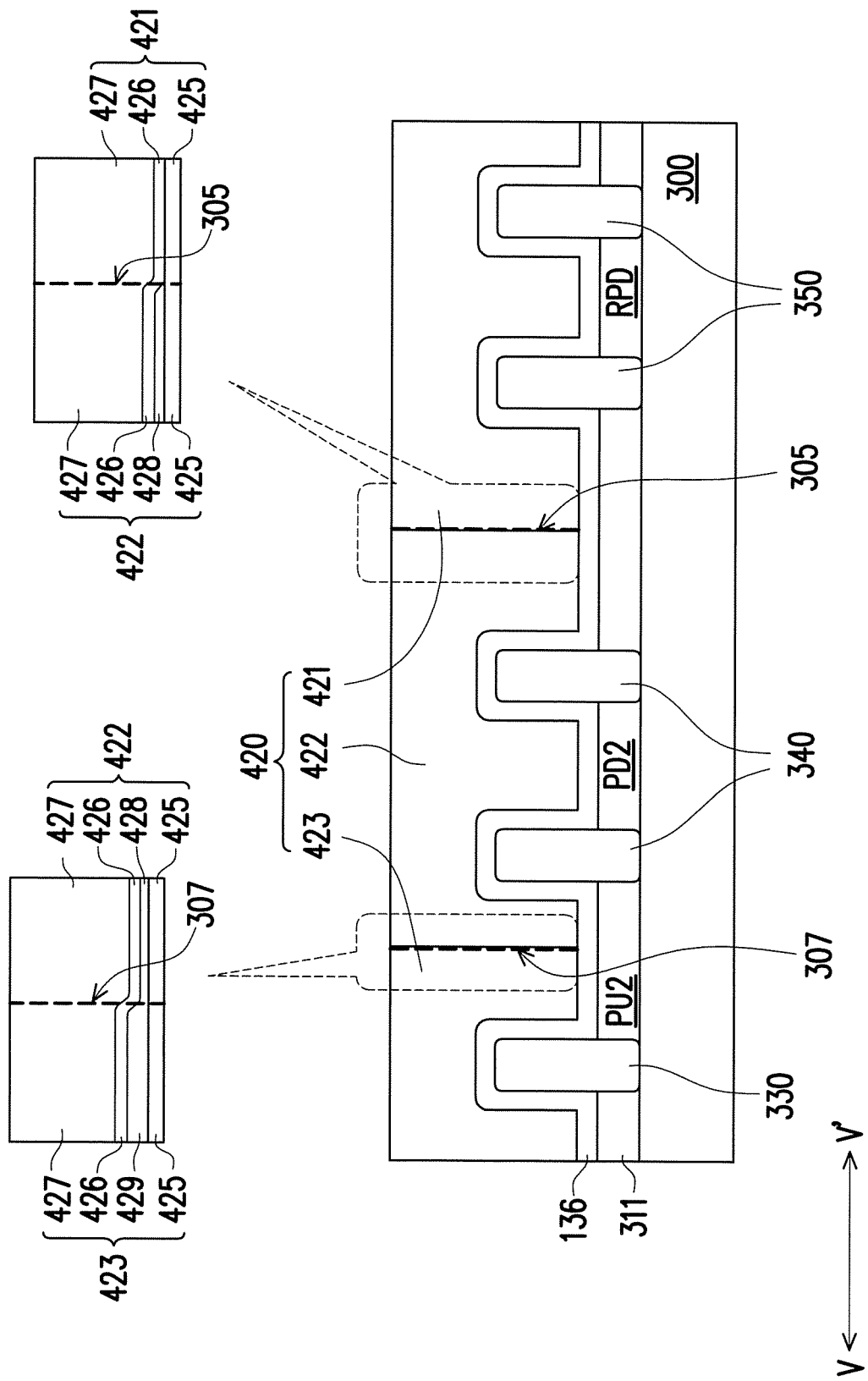
FIG. 5 illustrates a cross-sectional view taken along line V-V' in FIG. 4.

FIG. 5 illustrates a cross-sectional view taken along line V-V' in FIG. 4.

Referring to FIG. 3A, the SRAM cell 10 is formed in a region defined by first and second boundaries 301 and 302 parallel to the X direction and third and fourth boundaries 303 and 304 parallel to the Y direction and connected between the first and second boundaries 301 and 302. In other words, the region has a rectangular shape enclosed by the boundaries 301-304. The region defined by the first through fourth boundaries 301 through 304 includes three wells which are an N-type well Nwell located at a center thereof and first and second P-type wells Pwell located on opposite sides of the N-type well Nwell. Although in FIG. 3A, only the boundaries of the N-type well Nwell are marked, one having ordinary skill in the art should understand that the first and second P-type wells Pwell occupy the remaining portions of the SRAM cell 10, without considering the size of the isolation region, if existing therebetween.

In some embodiments, in a case in which a layer crosses one of boundaries of a cell or extends from one boundary to another boundary, the layer is symmetrically arranged with reference to the one boundary. That is, if an SRAM cell and another SRAM cell adjacent to the SRAM cell sharing the same boundary with the SRAM cell, a layer which crosses the same boundary is continuously formed such that portions of the layer located in the two SRAM cells constitute an integral continuous layer. For example, as shown in FIGS. 3A and 4, first semiconductor fins 310 each extend continuously between the first and second boundaries 301 and 302 and can further extend continuously to another SRAM cell (not shown) adjacent to the SRAM cell 10 in the Y direction.

On the other hand, in a case in which a layer is spaced apart from one of boundaries of a cell, the layer is discontinuously formed in two immediately adjacent cells. That is, if an SRAM cell and another SRAM cell adjacent to the SRAM cell sharing the same boundary with the SRAM cell, the second gate electrode layer 420 is spaced apart from the fourth boundary 304 and is not directly coupled to a corresponding second gate electrode layer 420 formed in the other SRAM cell immediately adjacent thereto. In this case, the second gate electrode layers 420 of two immediately adjacent cells are spaced apart from each other.

As shown in FIG. 3A, the SRAM cell 10 includes the first semiconductor fins 310, a second semiconductor fin 320, a third semiconductor fin 330, fourth semiconductor fins 340, and fifth semiconductor fins 350 each extending along Y direction and sequentially arranged along the X direction. One or more fin field-effect transistors (FinFET) can be constructed based on the semiconductor fins.

A structure of semiconductor fins is illustrated by FIG. 5. As shown in FIG. 5, the semiconductor fins including the third semiconductor fin 330, the fourth semiconductor fins 340, and the fifth semiconductor fins 350 protrude from a substrate 300. Still referring to FIG. 5, isolation regions 311 such as shallow trench isolation can be formed over the substrate 300 to surround bottom portions of the semiconductor fins 330, 340, and 350. Although not shown in FIG. 5, the first semiconductor fins 310 and the second semiconductor fin 320 can be configured similar to the third semiconductor fin 330, the fourth semiconductor fins 340, and the fifth semiconductor fins 350. Other structures at a level above the isolation regions 311 shown in FIG. 5 will be described later.

Referring back to FIG. 3A or 4, the first, fourth, and fifth semiconductor fins 310, 340, and 350 each extend continuously between the first and second boundaries 301 and 302, and are respectively formed in the first and second P-type wells Pwell located on opposite sides of the N-type well Nwell. The second semiconductor fin 320, formed within the N-type well Nwell, extends from the second boundary 302 toward the first boundary but is spaced apart from the first boundary 301. The third semiconductor fin 330, formed within the N-type well Nwell, extends from the first boundary 301 toward the second boundary 302 but is spaced apart from the second boundary 302.

Source, drain, and channel regions of the first pass-gate transistor PG1 and the first pull-down transistor PD1 of the SRAM cell 10 are made by the first semiconductor fins 310. Source, drain, and channel regions of the second pass-gate transistor PG2 and the second pull-down transistor PD2 are made by the fourth semiconductor fins 340. Source, drain, and channel regions of the read pass-gate transistor RPG and the read pull-down transistor RPD are made by the fifth semiconductor fins 350. Source, drain, and channel regions of the first pull-up transistor PU1 of the SRAM cell 10 and source, drain, and channel regions of the second pull-up transistor PU2 of the SRAM cell 10 are made by the second and third semiconductor fins 320 and 330, respectively.

Referring to FIG. 3A or 4, the first semiconductor fins 310, the fourth semiconductor fins 340, and the fifth semiconductor fins 350 each include two parallel semiconductor fins to provide a larger driving current. In some embodiments, each of the first pass-gate transistor PG1, the first pull-down transistor PD1, the second pull-down transistor PD2, the second pass-gate transistor PG2, the read pass-gate transistor RPG, and the read pull-down transistor RPD is formed based on a single semiconductor fin. In other embodiments, each of the first pass-gate transistor PG1, the first pull-down transistor PD1, the second pull-down transistor PD2, the second pass-gate transistor PG2, the read pass-gate transistor RPG, and the read pull-down transistor RPD is formed based on more than two parallel connected sub-transistors, in which source, drain, and channel regions are arranged parallel to each other and a common gate electrode is formed over the more than two parallel channel regions.

As show in FIG. 3A, the SRAM cell 10 includes first and second gate electrode layers 410 and 420 spaced-apart from each other and aligned in the X direction. The first gate electrode layer 410 is formed over the channel region of the first pass-gate transistor PG1, and the second gate electrode layer 420 is formed over the channel regions of the second pull-up transistor PU2, the second pull-down transistor PD2, and the read pull-down transistor RPD. The SRAM cell 10 includes a third gate electrode layer 430 covering the channel region of the second pass-gate transistor PG2, a fourth gate electrode layer 440 covering the channel regions of the first pull-up transistor PU1 and the first pull-down transistor PD1, and a fifth gate electrode layer 450 covering the channel region of the read pass-gate transistor RPG. The third gate electrode layer 430, the fourth gate electrode layer 440, and the fifth gate electrode layer 450 are spaced-apart from each other and aligned to each other in the X direction.

The first pass-gate transistor PG1 and the first pull-down transistor PD1 of the SRAM cell 10 have the drain regions thereof directly coupled to each other by a central portion of the first semiconductor fins 310. The drain region of the first pull-up transistor PU1 is connected to the coupled drain regions of the first pass-gate transistor PG1 and the first pull-down transistor PD1 through a longer contact 710. The second pass-gate transistor PG2 and the second pull-down transistor PD2 of the SRAM cell 10 have the drain regions thereof directly coupled to each other by a central portion of the fourth semiconductor fins 340. The drain region of the second pull-up transistor PU2 is connected to the coupled drain regions of the second pass-gate transistor PG2 and the second pull-down transistor PD2 through a longer contact 720. A longer contact having a rectangular shape in the layout view may have a thickness greater than a gate contact, such that the longer contact can connect source or drain region or a silicide layer over the source or drain region to a via via0 or can be electrically connected to a gate electrode layer through a gate contact formed thereon.

The longer contacts 710 and 720 are electrically connected to the second and fourth gate electrode layers 420 and 440 respectively through butt contacts 630 and 660 formed thereon. Thus, the drain regions of the first pass-gate transistor PG1, the first pull-down transistor PD1, and the first pull-up transistor PU1, and the second gate electrode layer 420 covering channels of the second pull-up transistor PU2 and the second pull-down transistor PD2 are electrically connected by the longer contact 710 and the butt contact 630. The longer contact 710 and the butt contact 630 act as the first local connection electrode ND11 shown in FIG. 1. The drain regions of the second pass-gate transistor PG2, the second pull-down transistor PD2, and the second pull-up transistor PU2, and the fourth gate electrode layer 440 covering channels of the first pull-up transistor PU1 and the first pull-down transistor PD1 are electrically connected by the longer contact 720 and the butt contact 660. The longer contact 720 and the butt contact 660 act as the second local connection electrode ND12 shown in FIG. 1.

The SRAM cell 10 includes a longer contact 795, aligned to the longer contacts 710 and 720, and electrically contacts a portion of the fifth semiconductor fins 350 which acts as drain regions of the read pass-gate transistor RPG and the read pull-down transistor RPD.

The SRAM 10 includes additional longer contacts including longer contacts 730, 740, 750, 760, 770, 780, and 790. The longer contact 730 electrically contacts a portion of the first semiconductor fins 310 which forms the source region of the first pass-gate transistor PG1, such that the source region of the first pass-gate transistor PG1 can be electrically connected to the first bit line BL through the longer contact 730 and a via via0 formed thereon. The longer contact 740 electrically contacts a portion of the third semiconductor fin 330 which forms the source region of the second pull-up transistor PU2, such that the source region of the second pull-up transistor PU2 can be electrically connected to the power supply line Vdd through the longer contact 740 and a via via0 formed thereon. The longer contact 750 electrically connects a portion of the fourth semiconductor fins 340 which forms the source region of the second pull-down transistor PD2 and a portion of the fifth semiconductor fins 350 which forms the source region of the read pull-down transistor RPD. The longer contact 760 electrically contacts a portion of the fourth semiconductor fins 340 which forms the source region of the second pass-gate transistor PG2, such that the source region of the second pass-gate transistor PG2 can be electrically connected to the second bit line BLB through the longer contact 760 and a via via0 formed thereon. The longer contact 770 electrically contact a portion of the second semiconductor fin 320 which forms the source region of the first pull-up transistor PU1, such that the source region of the first pull-up transistor PU1 can be electrically connected to the power supply line Vdd through the longer contact 770 and a via via0 formed thereon. The longer contact 780 electrically contacts a portion of the first semiconductor fins 310 which forms the source region of the first pull-down transistor PD1. The longer contacts 730, 740, and 750 are aligned to each other along the X direction and disposed over the first boundary 301, the longer contacts 760, 770, and 780 are aligned to each other along the X direction and disposed over the second boundary 302, and the longer contacts 710 and 720 are aligned to each other in the X direction and disposed in an intermediate region of the SRAM cell 10. The first and second gate electrode layers 410 and 420 are aligned to each other in the X direction and disposed in a region between the longer contacts 730, 740, and 750, and the longer contacts 710 and 720. The third and fourth gate electrode layers 430 and 440 are aligned to each other in the X direction and disposed in a region between the longer contacts 760, 770, and 780, and the longer contacts 710 and 720. That is, patterns of the gate electrode layers and patterns of the longer contacts are alternately arranged in the Y direction.

Still referring to FIG. 3A, a first metal layer M1, which forms the power supply line Vdd, the first and second bit lines BL and BLB, can additionally form first and second word line contacts WC1 and WC2 which are respectfully electrically connected to the first and third gate electrode layers 410 and 430 through gate contacts 620 and 650 and vias via0 formed thereon. A read word line contact RWC, also made by the first metal layer M1, is electrically connected to the fifth gate electrode layer 450 through a gate contact 610 and vias via0 formed thereon. The word line contacts WC1 and WC2 can be electrically connected, through vias via1 above the first metal layer M1, to a write word line WWL formed of a second metal layer M2 above the vias via1, and the read word line contact RWC can be electrically connected, through via via1 above the first metal layer M1, to a read word line RWL formed of the second metal layer M2.

The second metal layer M2 also forms the first, second, and third power supply lines Vss1, Vss2, and Vss3 extending parallel to the Y direction. The first power supply line Vss1 is electrically connected to the longer contact 780 through a via via1 therebetween, such that the source region of the first pull-down transistor PD1 can be electrically connected to the first power supply line Vss1. The second power supply line Vss2 is electrically connected to the longer contact 750 through a via via1 therebetween, such that the source region of the second pull-down transistor PD2 can be electrically connected to the second power supply line Vss2. The third power supply line Vss3 is electrically connected to the longer contact 790 through a via via1 therebetween, such that the source region of the read pass-gate transistor RPG can be electrically connected to the third power supply line Vss3. Although not shown, the first, second, and third power supply lines Vss1, Vss2, and Vss2 can be electrically connected to each other, for example, by one or more metal layers formed on an upper level of the first, second, and third power supply lines Vss1, Vss2, and Vss2, and vias therebetween, according to some embodiments.

According to some embodiments, the transistors in the write-port portion of the SRAM cell 10 are standard threshold voltage (SVT) devices, while the transistors in the read-port portion of the SRAM cell 10 are low threshold voltage (LVT) devices or ultra-low threshold voltage (ULVT) devices. As such, the SRAM cell 10 can have a reduced current leakage at the time maintaining the stored data as compared to a comparative SRAM cell in which transistors in the write-port portion thereof are LVT devices or ULVT devices, and the SRAM cell 10 can have an improved pull-down capability to ensure an faster operation speed as compared to a comparative SRAM cell in which transistors in the read-port portion thereof are SVT devices. Here, SVT, LVT, and ULVT refer to an absolute value of the threshold voltages. For the same type transistors, LVT is less than SVT and greater than ULVT.

In some embodiments, an SVT of the N-type transistors such as the first and second pass-gate transistors PG1 and PG2 and the first and second pull-down transistors in the SRAM cell 10 is about 110 nm to about 120 nm, and the SVT of the P-type transistors such as the first and second pull-down transistors PU1 and PU2 in the SRAM cell 10 is about 117 nm to about 127 nm. In some embodiments, an LVT or a ULVT of the N-type transistors such as the read pull-down transistor RPD and the read pass-gate transistor RPG in the SRAM cell 10 is about 243 nm to about 253 nm.

To achieve an LVT or a ULVT in the read-port portion and an SVT in the write-port portion of the SRAM cell 10, first through third sections 421, 422, and 423 shown in FIG. 5, constituting the continuous second gate electrode layer 420, respectively cover at least the channel region of the read pull-down transistor RPD, at least the channel region of the second pull-down transistor PD2, and at least the channel region of the second pull-up transistor PU2, and contain one or more materials different from each other or have different thicknesses of corresponding layers in the first through third sections 421, 422, and 423. In some embodiments, to obtain different threshold voltages, different work function adjustment layers with suitable thicknesses can be used. Variations in the work function adjustment layers contained in the first through third sections can obtain suitable work function levels of the first through third sections.

Referring to FIG. 5, each of the first, second, and third sections 421, 422, and 423 is disposed over a gate insulating layer 136 including, for example, an interfacial dielectric layer such as $SiO_2$, $Si_3N_4$, SiON, and/or mixture thereof, a high-k dielectric layer such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixture thereof, and/or a titanium silicon nitride (TSN) layer.

Still referring to FIG. 5, in some embodiments, the first section 421 covering at least the channel region of the read pull-down transistor RPD, the second section 422 covering at least the channel region of the second pull-down transistor PD2, and the third section 423 covering at least the channel region of the second pull-up transistor PU2 each include a multilayer structure including, for example, work function adjustment layers 425 and 426, and a conductive layer 427, made of, for example, W, stacked on the work function adjustment layers 425 and 426. In some embodiments, the work function adjustment layers 425 and 426 are TaN and TiAl layers, respectively; the present disclosure, however, is not limited thereto. In other embodiments, Ta, Pt, Ru, Mo, TiSi, PtTa, $WSi_2$, TiSiN, TaSiN, TiAlN, TaCN, NiSi, or a combination thereof can be used as work function adjustment layers. One of ordinary skill in the art should recognize that the listed exemplary layers in the multilayer structure are merely an example, and additional layers can be further included in other embodiments or one of the above materials can be omitted.

In some embodiments, the multilayer structure of the second section 422 further includes another work function adjustment layer 428 made of, for example, TiN or other suitable material such as Ta, Pt, Ru, Mo, TiSi, PtTa, $WSi_2$, TiSiN, TaSiN, TiAlN, TaCN, NiSi, or combination thereof, between the work adjustment function layers 425 and 426. The multilayer structure of the third section 423 further includes another work function adjustment layer 429 made of, for example, TiN or other suitable material such as Ta, Pt, Ru, Mo, TiSi, PtTa, $WSi_2$, TiSiN, TaSiN, TiAlN, TaCN, NiSi, or combination thereof, between the work function adjustment layers 425 and 426. On the other hand, the multilayer structure of the first section 421 does not contain either the work function adjustment layer 428 contained in the second section 422 or the work function adjustment layer 429 contained in the third section 423. In this case, the numbers of the work function adjustment layers in the first to third sections 421, 422, and 423 are different from each other.

Although each commonly contained layer in the multilayer structures of the first, second, and third sections 421, 422, and 423 continuously extends to cover the channel regions of the read pull-down transistor RPD, the second pull-down transistor PD2, and the second pull-up transistor PU2, due to the additional work function adjustment layer 428 in the multilayer structure of the second section 422 and the absence of such an additional work function adjustment layer in the multilayer structure of the first section 421, the first section 421 and the second section 422 have a metal junction 305 at an interface where the additional work function adjustment layer 428 starts (or ends).

In some embodiments, the second section 422 and the third section 423 have a metal junction 307 at an interface where the thickness of the additional work function adjustment layer changes, if the additional work function adjustment layer 428 and the additional work function adjustment layer are made of the same material, for example, TiN. If the additional work function adjustment layer 428 and the additional work function adjustment layer 429 are made of the same material, the thickness of the additional work function adjustment layer 428 is less than that of the additional work function adjustment layer 429. In one embodiment, the thickness of the additional work function adjustment layer 428 in the second section 422 can be from about 10 nm to about 15 nm, and the additional work function metal layer 429 in the third section 423 can be from about 20 nm to about 30 nm. The present disclosure, however, is not limited thereto.

In other embodiments, the additional work function adjustment layer 428 and the additional work function adjustment layer 429 can be made of different materials and the second section 422 and the third section 423 have the metal junction 307 at an interface where the different work function metals join each other. In this case, the thickness of the additional work function adjustment layer 428 can be the same, greater than, or less than that of the additional work function adjustment layer 429, in accordance with the selection of the additional work function metals.

In some embodiments, adding the additional work function layers 428 and/or 429 and/or changing the thicknesses thereof can adjust a threshold voltage of the transistor covered thereby. For example, the second pull-down transistor PD2 and the read pull-down transistor RPD become an SVT device and an LVT device or an ULVT device, respectively, dependent on whether the additional work function adjustment layer 428 is formed. The threshold voltage of the second pull-down transistor PD2, with respect to the threshold voltage of the read pull-down transistor PRD, can be tuned by adjusting the thickness of the additional work function adjustment layer 428.

Although not shown in the drawings, in other embodiments, the first section 421 can contain the same additional work function adjustment layer 428 contained in the second section 422, but with a smaller thickness than that of the additional work function adjustment layer 428 contained in the second section 422, such that the second pull-down transistor PD2 and the read pull-down transistor RPD are an SVT device and an LVT or an ULVT device, respectively.

According to some embodiments, the fourth gate electrode layer 440 shown in FIG. 4 can be configured to include two sections corresponding to the second and third sections 422 and 423 shown in FIG. 5. The one corresponding to the second section 422 covers at least the channel region of the first pull-down transistor PD1 and the other corresponding to the third section 423 covers at least the channel region of the first pull-up transistor PU1. According to some embodiments, the first and third gate electrode layers 410 and 430 correspond to the second section 422 of the second gate electrode layer 420. According to some embodiments, the fifth gate electrode layer 450 corresponds to the first section 421 of the second gate electrode layer 420. Here, "corresponding to" refers to the same or substantially the same vertical configuration of two respective gate electrode layers/sections. Accordingly, vertical structures of the first, third, and fourth gate electrode layers 410, 430, and 440 can refer to the vertical structures of the second and/or third sections 422 and 423 shown in FIG. 5, and a vertical structure of the fifth gate electrode layer 450 can refer to the vertical structure of the first section 421 shown in FIG. 5. To avoid redundancy, a description of the structure of the first, third, fourth, and fifth gate electrode layers 410, 430, 440, and 450 will be omitted.

As such, the first pull-down transistor PD1 and the first and second pass-gate transistors PG1 and PG2, together with the second pull-down transistor PD2, are N-type SVT devices, and the first and second pull-up transistors PU1 and PU2 are P-type SVT devices. On the other hand, the read pull-down transistor RPD and the read pass-gate transistor RPG are N-type LVT devices or N-type ULVT devices.

Now referring to FIGS. 3B and 4, an end 306 of the fourth gate electrode layer 440 and an end 309' of the second gate electrode layer 420 are asymmetric with respect to a geometric center C of the transistors in the write-port portion. Thus, even if another end 308 of the fourth gate electrode layer 440 and another end of the second gate electrode layer 420 are symmetric with respect to the geometric center C of the transistors in the write-port portion, the second gate electrode layer 420 and the fourth gate electrode layer 440 are naturally unbalanced (or asymmetric) with respect to the geometric center C, which deteriorates performance of the SRAM cell. Thus, an SRAM cell may have a lower operation speed, a lower device reliability, and a higher working voltage, if without any features according to embodiments of the present disclosure. The asymmetry configurations, if without any features according to embodiments of the present disclosure, could further increase a difference in the threshold voltages of the first and second pull-down transistor PD1 and PD2 when multiple threshold voltage levels, i.e., SVT in the write-port portion and LVT or ULVT, are introduced in the SRAM cell. An SRAM cell with the asymmetry configuration, if without any features according to embodiments of the present disclosure, is operated with a relatively higher Vccmin, the minimum voltage at which the SRAM cell will properly function, causing a waste in power.

Here, the geometric center C of the transistors in the write-port portion, representing the geometric center of the transistors of the write-port portion, is a point, at which two of a first line LPG connecting PG1C, a geometric center of the first pass-gate transistor PG1, and PG2C, a geometric center of the second pass-gate transistor PG2, a second line LPD connecting PD1C, a geometric center of the first pull-down transistor PD1, and PD2C, a geometric center of the second pull-down transistor PD2, and a third line LPU connecting PU1C, a geometric center of the first pull-up transistor PU1, and PU2C, a geometric center of the second pull-up transistor PU2, cross each other as shown in FIG. 3B. In some embodiments, the geometric center PD1C of the first pull-down transistor PD1, the geometric center PU1C of the first pull-up transistor PU1, the geometric center PG2C of the second pass-gate transistor PG2, and a geometric center RPGC of the read pass-gate transistor RPG are disposed on a line LH2 parallel to the X direction. The geometric center PG1C of the first pass-gate transistor PG1, the geometric center PU2C of the second pull-up transistor PU2, the geometric center PD2C of the second pull-down transistor PD2, and a geometric center RPDC of the read pull-down transistor RPD are disposed on a line LH1 parallel to the X direction.

In some embodiments, the end 306 of the fourth gate electrode layer 440 and the metal junction 305 of the first and second sections 421 and 422 of the second gate electrode layer 420 are disposed point symmetric with respect to the geometric center C, as the end 306 and the metal junction 305 are both tangential to lines L1 and L2 passing through the geometric center C, as shown in FIG. 3B. The present disclosure, however, is not limited thereto. In other embodiments, the metal junction 305 can be disposed at a location 305C1 to be closer to the geometric center C than the end 306 of the fourth gate electrode layer 440, or at a location 305C2 to be farther to the geometric center C than the end 306 of the fourth gate electrode layer 440, or any location between the locations 305C1 and 305C2.

In some embodiments, the other end 308 of the fourth gate electrode layer 440 and the other end 309 of the second gate electrode layer 420 are point symmetric with respect to the geometric center C.

According to some embodiments, to tune the threshold voltages of the transistors in the read-port portion to be within a predetermined range with respect to the threshold voltages of the transistors in the write-port portion, a counter doping process can be performed in the read-port portion and also in a portion in the write-port portion immediately adjacent to the read-port portion. In some embodiments, an annealing process can follow the counter doping process to activate the dopants.

Reference numeral 200 shown in FIGS. 3B and 4 represents the counter doped region to regulate threshold voltages of the transistors formed therein. One of ordinary skill in the art should understand that, during the counter doping process, only the region 200 is counter doped with impurities (dopants) provided in the counter doping process while the remaining region of the SRAM cell 10 is not doped with the impurities provided in the counter doping process. As such, the threshold voltages of the transistors in the read-port portion can be increased to a level according to design particulars, and in the meantime, the threshold voltage of the second pull-down transistor PD2 is increased to a level close to or substantially equal to that of the first pull-down transistor PD1, thereby reducing a difference in the threshold voltages of the first and second pull-down transistors PD1 and PD2 so as to mitigate or minimize the adverse effect caused by the asymmetric configuration of the second and fourth gate electrode layers 420 and 440.

In some embodiments, one or more of P-type dopants including, but not limited to, B, Al, N, Ga, In or combination thereof, in case in which the semiconductor fins are made of a Si based semiconductor material, can be used as dopants in the counter doping process. One of ordinary skill in the art should understand that the P-type dopants can be selected from other materials when the material for forming the semiconductor fins changes. In some embodiments, the doping concentration of the impurities is about $3 \times 10^{13}/cm^3$ to about $3.5 \times 10^{13}/cm^3$.

By counter doping the above exemplary impurities with the above doping concentration range into the read-port portion and also in the portion of the write-port portion immediately adjacent to the read-port portion, the difference of the threshold voltage of the second pull-down transistor PD2 and the threshold voltage of the first pull-down transistor PD1 is no more than, for example, 3%, and Vccmin, the minimum voltage at which the SRAM cell 10 will properly function, can be reduced, for example, by 55 mV to 60 mV. In some embodiments, the threshold voltage of the first pull-down transistor PD1 is slightly greater than that of the second pull-down transistor PD2. The difference is defined to be equal to an absolute value of $(V_{thPD1}-V_{thPD2})/V_{thPD1}*100\%$, in which $V_{thPD1}$ is the threshold voltage of the first pull-down transistor PD1 and $V_{thPD2}$ is the threshold voltage of the second pull-down transistor PD2.

On the other hand, if the doping concentration of the impurities is greater than about $3.5 \times 10^{13}/cm^3$, the SRAM cell 10 cannot properly function due to the overdoped impurities in the regions for forming the channel regions of the respective transistors, and if the doping concentration of the impurities is less than about $3\times10^{13}/cm^3$, the threshold voltage of the second pull-down transistor PD2 can still be significantly lower than that of the first pull-down transistor PD1, impacting the performance of the SRAM cell 10.

One of ordinary skill in the art should understand that if the impurities provided in the counter doping process is doped in the remaining region of the SRAM cell 10, such doping is unintended, which may be caused by, for example, diffusion of the impurities doped around the boundary of the region 200 and the remaining region and/or imperfect blocking by an implantation mask over the remaining region during the counter doping process. Such intended doping, if existing, is omitted to define the doped region 200 by the counter doping process.

One of ordinary skill in the art should understand that if the impurities pre-exist in the remaining region prior to the counter doping process due to the impurities pre-exist in the substrate for manufacturing the SRAM cell 10 or due to forming a well in the region 200. Such impurities, which have a concentration level lower than those implanted by the counter doping process, are not counted to determine the doping concentration of the dopants by the counter doping process.

As shown in FIG. 4, the region 200 extends continuously along the −X direction from the fourth boundary 304 to an intermediate region between the third semiconductor fin 330 and the fourth semiconductor fins 340, and extends continuously between the first and second boundaries 301 and 302. In some embodiments, a boundary of the region 200 in the intermediate region between the third semiconductor fin 330 and the fourth semiconductor fins 340 linearly extends along the Y direction.

Still referring to FIG. 4, S0 is a distance in the X direction between the third semiconductor fin 330 and the fourth semiconductor fins 340, and S1 is a distance in the X direction between the fourth semiconductor fins 340 and the boundary of the region 200 in the intermediate region between the third semiconductor fin 330 and the fourth semiconductor fins 340. In some embodiments, S1 and S0 satisfy 0.4≤S1/S0≤0.5, such that the threshold voltage of the second pull-down transistor PD2 and the threshold voltage of the second pull-up transistor PU2 can be secured. On the other hand, if the S1/S0 is less than 0.4, the threshold voltage of the second pull-down transistor PD2 cannot be effectively regulated to be substantially equal to or significantly close to that of the first pull-down transistor PD1, and if the S1/S0 is greater than 0.5, the threshold voltage of the second pull-up transistor PU2 can be affected to be not substantially equal to that of the first pull-up transistor PU1.

FIGS. 6-9 illustrate cross-sectional views taken along line V-V' in FIG. 4 showing process steps to manufacture the SRAM cell. For convenience, only the structures visible taken along line V-V' will be described. One of ordinary skill in the art should recognize that the other structures not visible taken along line V-V' can be manufactured accordingly, and thus such descriptions will be omitted.

Figure 6:
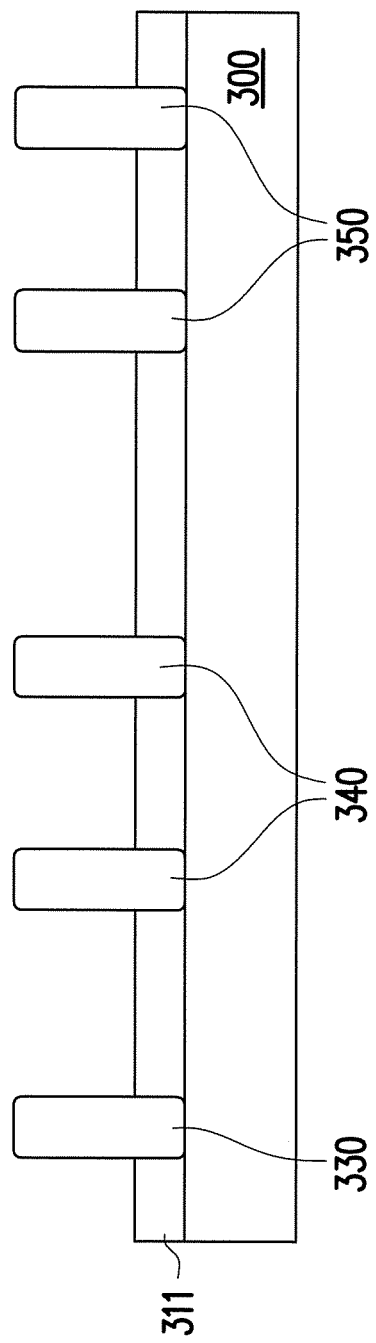
FIG. 6 illustrates a cross-sectional view taken along line V-V' in FIG. 4 showing a process step to manufacture the SRAM cell.

As shown in FIG. 6, the third, fourth, and fifth semiconductor fins 330, 340, and 350 are formed to protrude from the semiconductor substrate 300. The semiconductor substrate 300 can be a semiconductor substrate formed of, for example, one of Si, Ge, SiGe, SiC, SP, SiPC, InP, InAs, GaAs, AlInAs, InGaP, InGaAs, GaAsSb, GaPN, AlPN, and any other suitable material. An isolation layer 311, such as shallow trench isolation (STI), can cover lower portions of the third, fourth, and fifth semiconductor fins 330, 340, and 350.

The third, fourth, and fifth semiconductor fins 330, 340, and 350 can be formed by removing portions of the substrate 300. In other embodiments, the third, fourth, and fifth semiconductor fins 330, 340, and 350 can be made of a device layer of a silicon-on-insulator (SOI). In this case, portions of the device layer are removed and intermediate portions between the portions to be removed remain and become the third, fourth, and fifth semiconductor fins 330, 340, and 350. In other embodiments, the third, fourth, and fifth semiconductor fins 330, 340, and 350 can grow on the substrate 300 by an epitaxy process, and in this case, the third, fourth, and fifth semiconductor fins 330, 340, and 350 can be formed of a material substantially the same as, or different from, that of the substrate 300.

Figure 7:
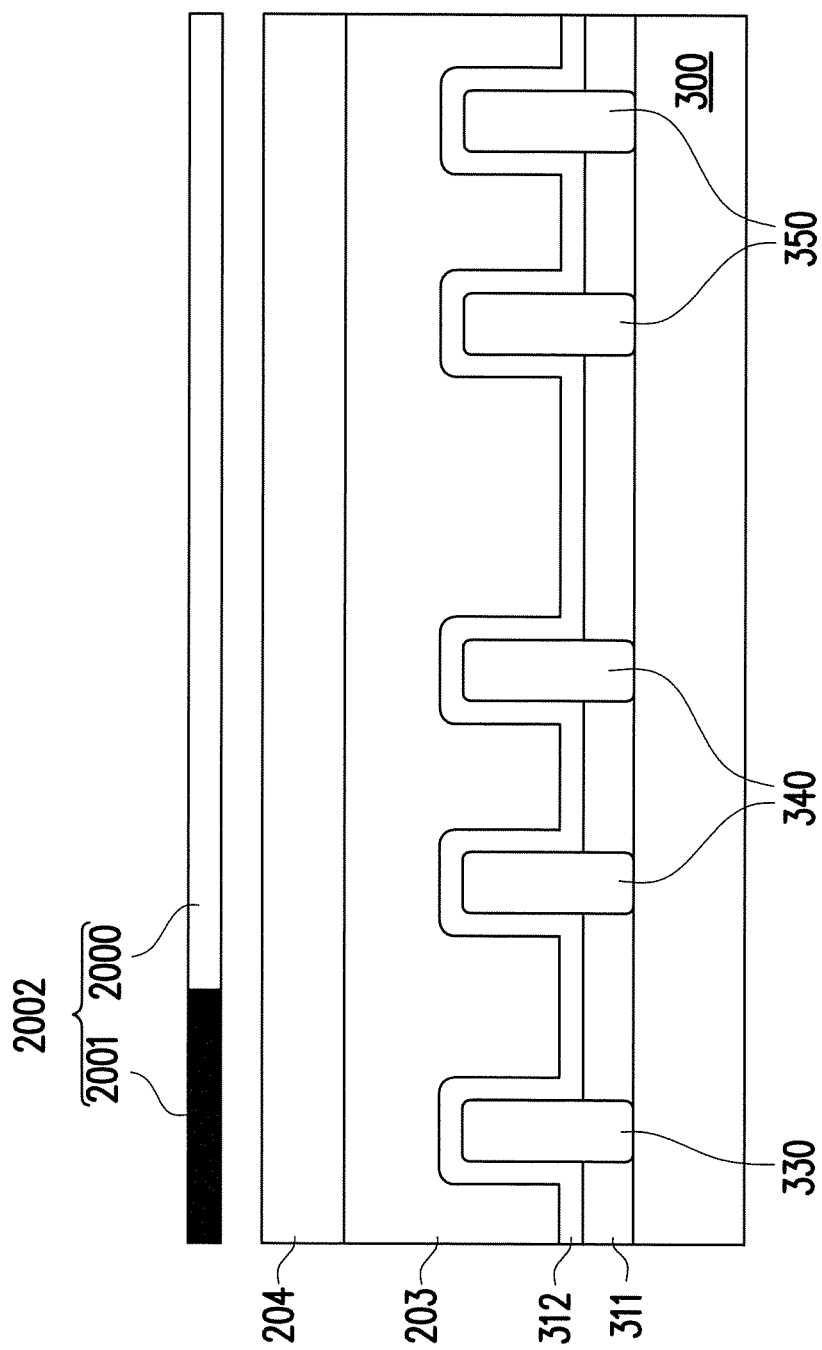
FIG. 7 illustrates a cross-sectional views taken along line V-V' in FIG. 4 showing a process step to manufacture the SRAM cell.

As shown in FIG. 7, a protection layer 312 such as a $SiO_2$ layer having a thickness, for example, from about 1.5 nm to about 3 nm, is formed to cover channel regions of the respective transistors. Then, a BARC layer 203, acting as a planarization layer, fills up the spaces between the third, fourth, and fifth semiconductor fins 330, 340, and 350 and forms a flat upper surface. In this case, no additional planarization step such as chemical mechanical polishing/planarization (CMP) is performed. The thickness and material choice of the BARC layer 203 are selected to be suitable for lithography according to the 193 nm technology and/or beyond such as the extreme ultraviolet lithography (EUV) technology. In some embodiments, the BARC layer 203 can be a Polymethylmethacrylate (PMMA) layer or any other suitable material. In some embodiments, a planarization process can be performed to secure flatness of the top surface of the BARC layer 203 to have a more uniformly coated photoresist layer 204. In some embodiments, the BARC layer 203, disposed below the photoresist layer 204, acts as a bottom anti-reflective coating (BARC) layer. In other embodiments, the BARC layer 203, together with the protection layer 312 to prevent the BARC layer 204 from directly contacting the third, fourth, and fifth semiconductor fins 330, 340, and 350, can be omitted.

Still referring to FIG. 7, a mask 2002 having a transparent region 2000 corresponding to the region 200 and an opaque region 2001 corresponding to the remaining region other than the region 200 can be used to pattern the photoresist layer 204.

Figure 8:
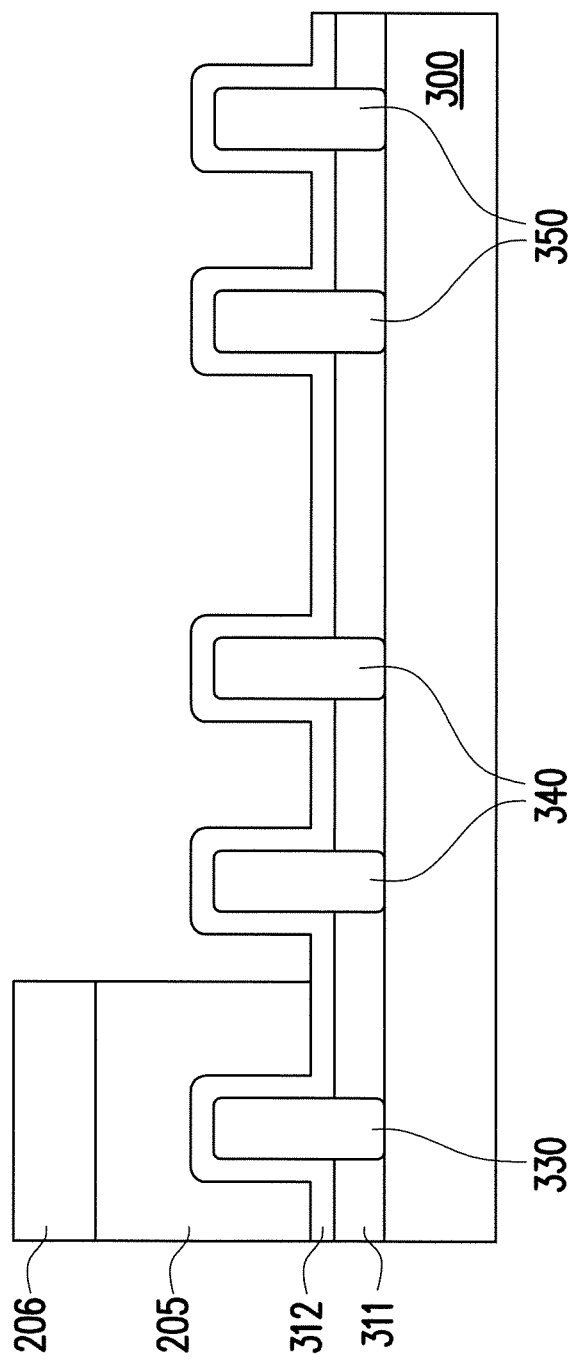
FIG. 8 illustrates a cross-sectional views taken along line V-V' in FIG. 4 showing a process step to manufacture the SRAM cell.

After aligning the mask 2002 with respect to the third, fourth, and fifth semiconductor fins 330, 340, and 350, a photolithography process can be performed, followed by a development process, such that the photoresist layer 204 is patterned to be a photoresist pattern 206 shown in FIG. 8. The exposed portion of the BARC layer 203 by the photoresist pattern 206 is removed, for example, by wet or drying etching, such that the BARC layer 203 becomes a BARC pattern 205.

Figure 9:
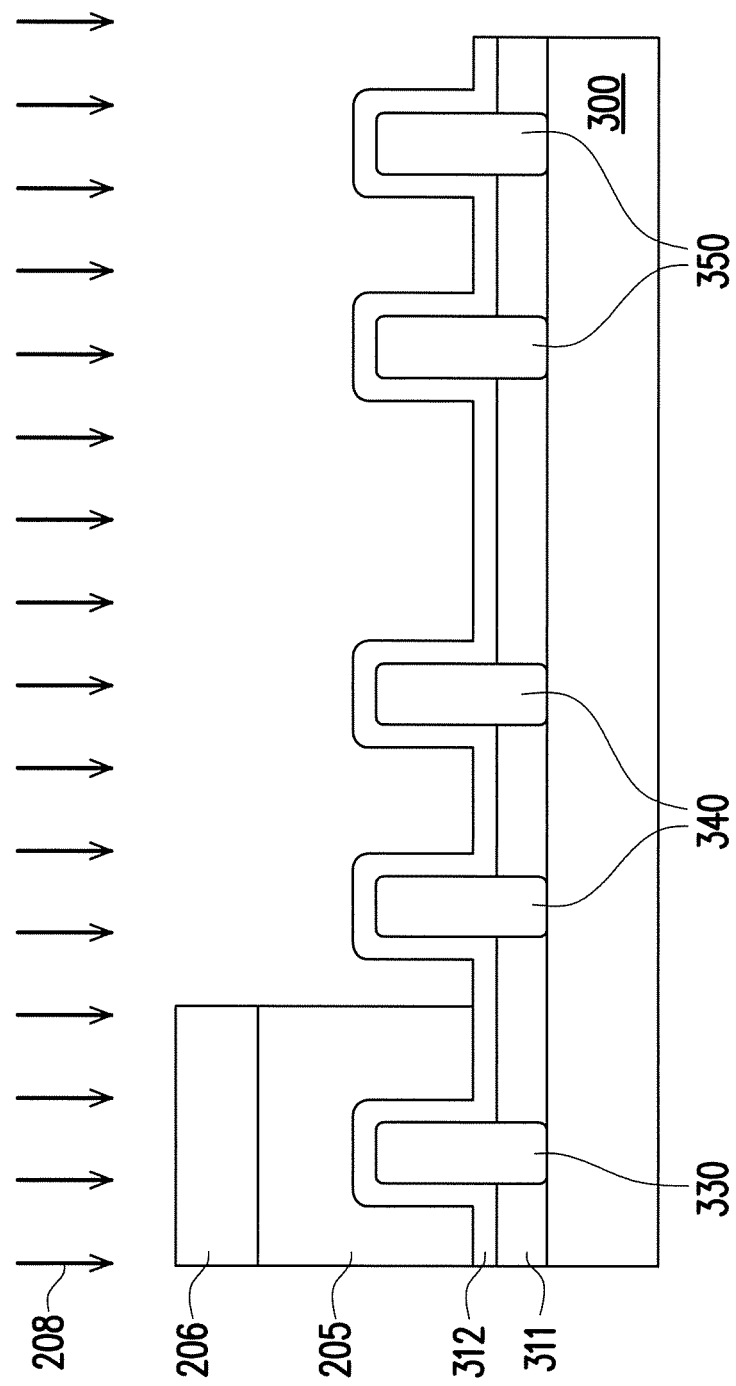
FIG. 9 illustrates a cross-sectional views taken along line V-V' in FIG. 4 showing a process step to manufacture the SRAM cell.

As shown in FIG. 9, using the photoresist pattern 206 and the BARC pattern 205 as an implantation mask, the counter doping process is performed with an implantation energy level of about 10 keV to about 20 keV. The dopants used in the counter doping process and the doping concentration have been described above and thus will not be repeated here. In some embodiments, an annealing process can be performed after the counter doping process.

Still referring to FIG. 9, a path along which the dopants are intended to be provided is substantially perpendicular to a planner surface of the substrate 300. The present discourse is not limited thereto. In other embodiments, the path along which the dopants are intended to be implanted can be equal to or smaller than about 15° inclined with a plane parallel to the extending direction of the third, fourth, and fifth semiconductor fins 330, 340, and 350 and perpendicular to the planner surface of the substrate 300. As such, implantation to side surface region of the third, fourth, and fifth semiconductor fins 330, 340, and 350 can be more effectively performed.

Although not shown in the drawings, thereafter, the photoresist pattern 206, the BARC pattern 205, and the protection layer 312 are removed.

The remaining processes to form the SRAM cell 10 will be described with reference to FIG. 10.

Figure 10:
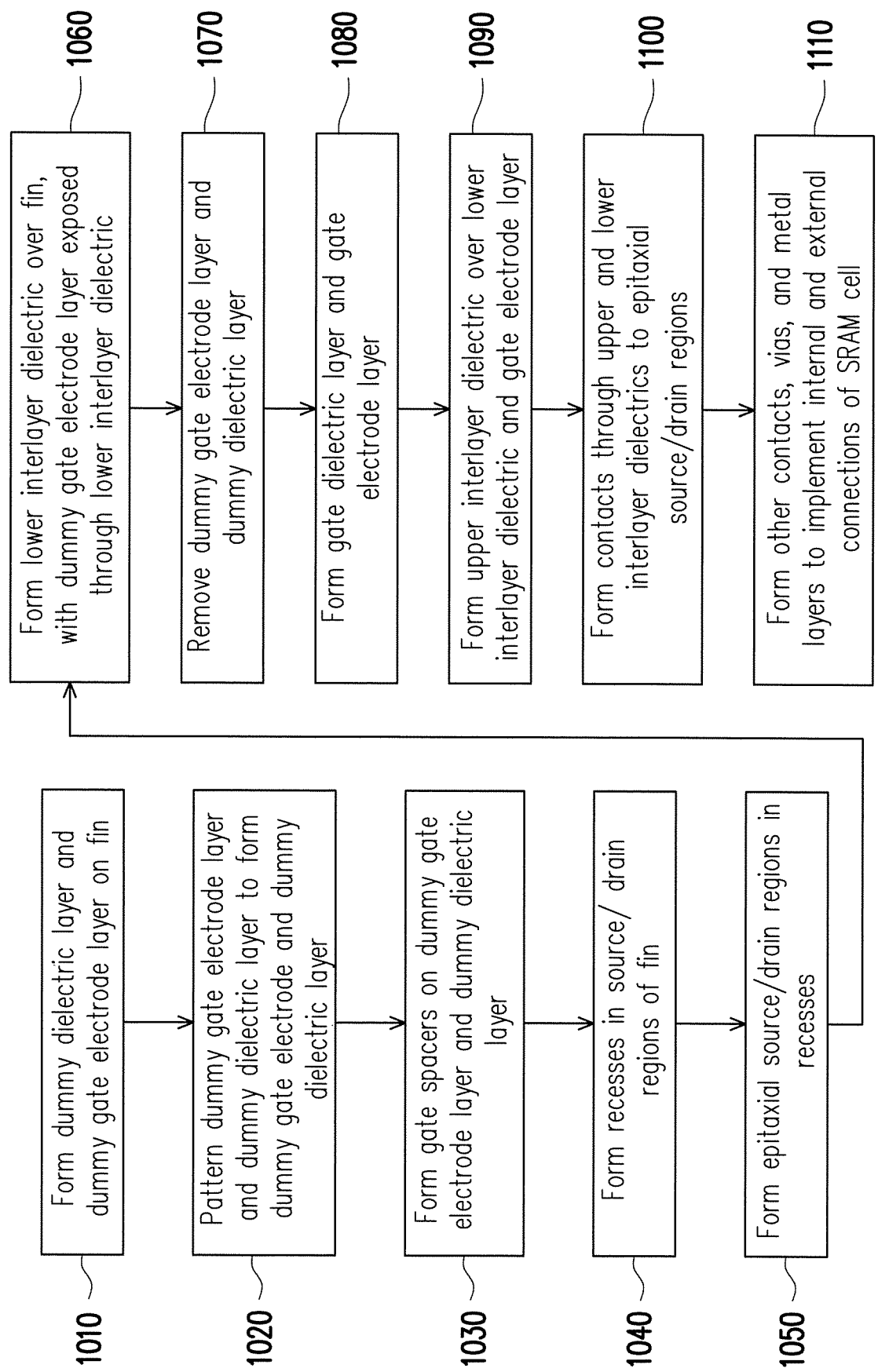
FIG. 10 illustrates a process flow chart to manufacture an SRAM.

Referring to FIG. 10, a dummy dielectric layer and a dummy gate electrode layer are formed on the above formed semiconductor fins with the suitable counter dopants (1010). The dummy dielectric layer and a dummy gate electrode layer are patterned by a photolithography process (1020). Then, gate spacers are formed on the dummy gate electrode layer and the dummy dielectric layer (1030). Recesses are then formed by removing portions of the semiconductor fins not covered by the dummy dielectric layer and the dummy gate electrode layer (1040). Thereafter, source and drain regions are formed in the recessed portions by growing an epitaxial layer (1050). Then, a lower interlayer dielectric layer is formed to cover the dummy gate electrode layer, and followed by a CMP process performed to the lower interlayer dielectric layer, the dummy gate electrode layer is exposed (1060). Then, the dummy gate electrode layer and the dummy dielectric layer are removed (1070) to form a gate space. Next, a dielectric layer such as the aforementioned gate insulating layer 136 is formed and gate electrode layers each including, for example, one or more of the sections 421, 422, and 433 described above, are formed over the semiconductor fin (1080) in the gate space. Thereafter, an upper interlayer dielectric is formed over the lower interlayer dielectric and the gate electrode layer (1090). The upper interlayer dielectric is patterned to have openings opening the source and drain regions, such that contacts can be formed in the openings (1100). Next, additional one or more interlayer dielectrics are formed and patterned, followed by a metal deposition process, so as to form other contacts, vias, and metal layers, thereby implement internal and external connections of the SRAM cell 10.

The manufacturing method of the SRAM 10 should not be limited thereto. The sequence of the above steps can be modified. For example, the counter doping process to raise the threshold voltages of the respective transistors can be performed, for example, after step 1070 and before step 1080.

According to some embodiments, additional doping processes can be performed before or after the counter doping process, resulting in change in the doping concentration of the dopants in the semiconductor fins, if the counter doping process and the additional doping processes provide the same dopants. One of ordinary skill in the art should understand that the dopants provided in the counter doping process are doped into the designated region and are not applied in the non-designated region, even if the additional dopants are doped in the additional doping process, the additional dopants are substantially equally applied into corresponding regions in the semiconductor fins for forming the same type transistors. Thus, corresponding regions of two same type transistors, one counter doped and the other not counter doped, for example, channel regions of the two same type transistors, will have different doping concentrations of the dopants. According to some embodiment, if B is used in the counter doping process, a first N-type transistor to which the counter doping process is performed and a second N-type transistor to which the counter doping process is not performed, the concentration of B in the channel region of the first N-type transistor is greater than that of the channel region of the second N-type transistor, even if B is doped, for example, during formation of the N-type well.

As to the doping concentration, it is determined in a region that the dopants are substantially uniformly distributed where the doping concentration is greater than that in a peripheral region immediately adjacent to or surrounding such a region. That is, the doping concentration described in the present disclosure does not refer to a doping concentration in a lateral edge portion adjacent to the designed doped portion, a shallower portion above the designed doped region, or a deeper region below the designed doped region. In some embodiments, when two doping concentrations are compared with each other, the two doping concentrations are determined at substantially the same depth level from a reference surface.

Figure 11:
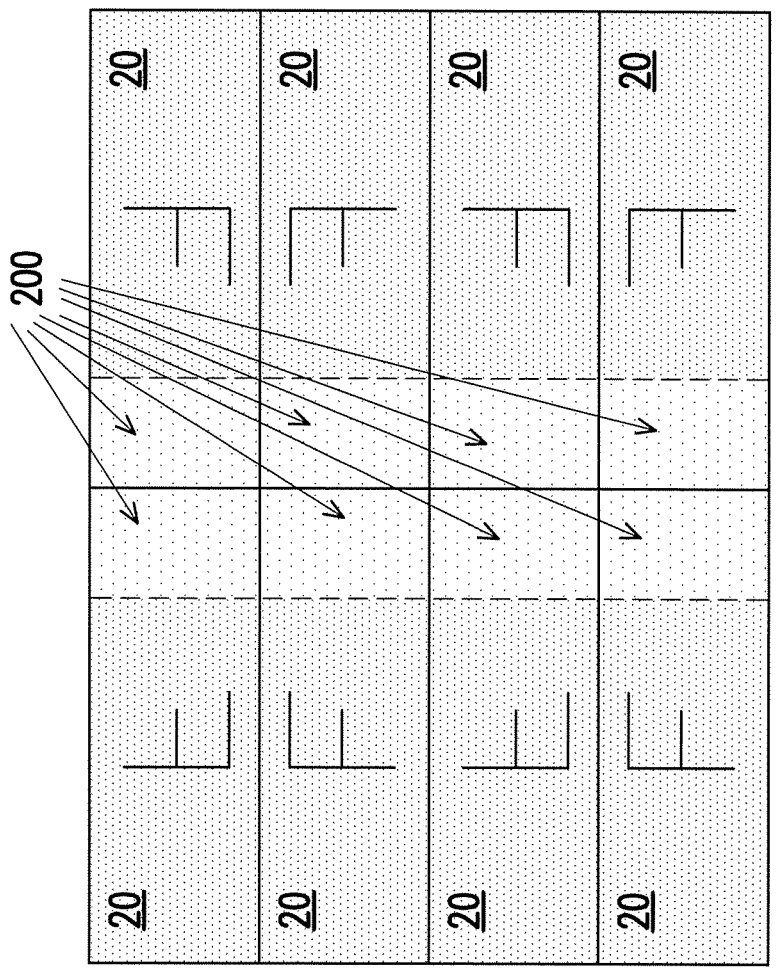
FIG. 11 shows a layout of an array of SRAM cells according to some embodiments of the present disclosure.

FIG. 11 shows a layout of an array of SRAM cells according to the present disclosure.

Referring to FIG. 11, a plurality of SRAM cells 20 are arranged in the X direction and the Y direction form an array of SRAM cells. In some embodiments, two immediately adjacent SRAM cells 20 in the X direction are line symmetric with respect to a common boundary therebetween and two immediately adjacent SRAM cells 20 in the Y direction are line symmetric with respect to a common boundary therebetween. In this case, the regions 200 to which the impurities are doped in the counter doping process of the plurality of SRAM cells 20 of two immediate adjacent columns form one continuous region.

In the aforementioned embodiments, the region 200 in one SRAM cell is one continuous region. The present disclosure is not limited thereto.

Figure 12A:
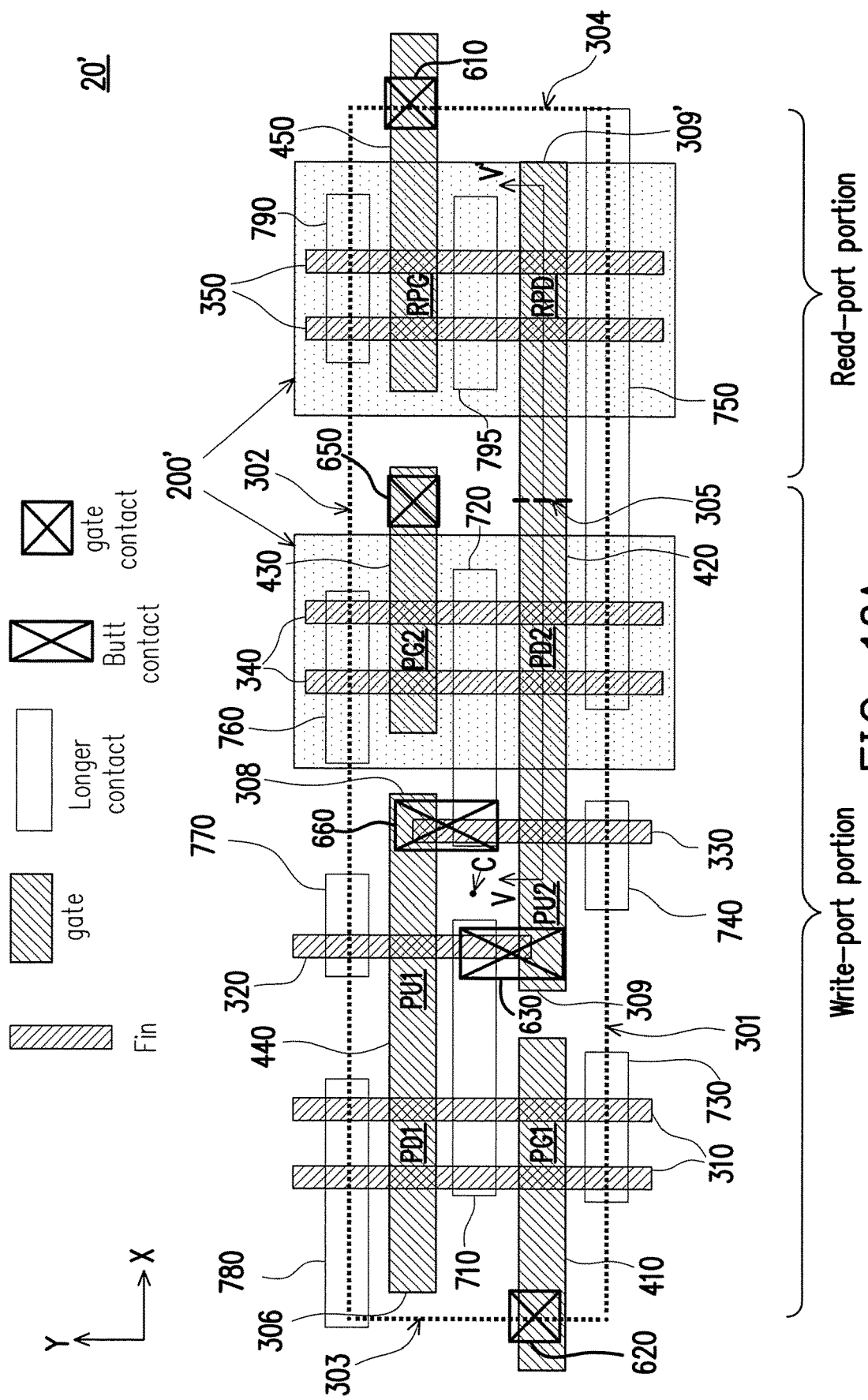
FIGS. 12A and 12B show a modified layout corresponding to the layouts shown in FIGS. 4 and 11, respectively.
Figure 12B:
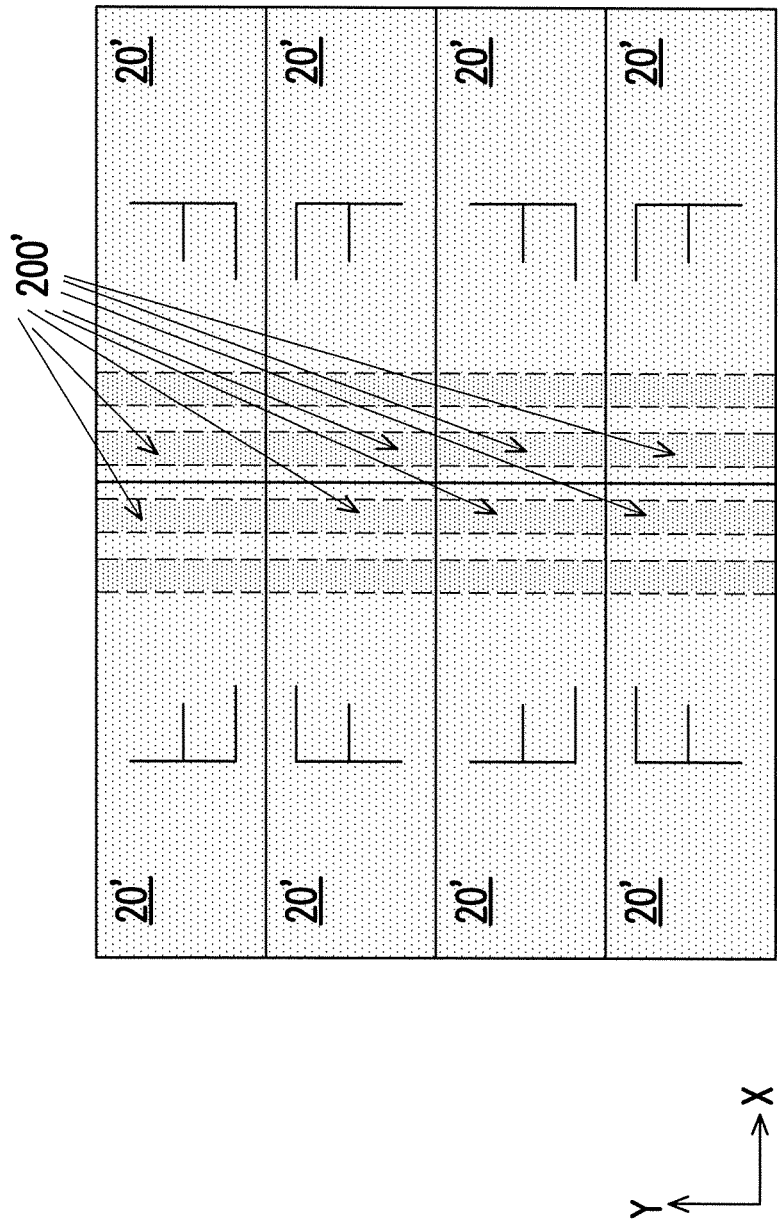

FIGS. 12A and 12B show a modified layout corresponding to the layouts shown in FIGS. 4 and 11, respectively.

The same reference numeral/character in the drawings represents the same or similar element having the same feature. To avoid redundancy, overlapped descriptions will be omitted and the features different from those already described will be described in the following.

Referring to FIGS. 12A and 12B, reference numeral 200' represents the regions to which the impurities are doped in the counter doping process. As compared to the region 200 shown in FIGS. 4 and 11, the region 200' in the layout 20' shown in FIG. 12A includes two discrete portions spaced apart from each other in the X direction. Each of the two discrete portions covers either the fourth semiconductor fins 340 or the fifth semiconductor fins 350. As such, the impurities can be doped into the portions, such as the semiconductor fin regions and therearound, which can more effectively regulate the threshold voltages of the respective transistors, excluding an intermediate region between the semiconductor fin regions, as compared to the example shown in FIGS. 4 and 11.

Although not shown in the drawings, in other embodiments, the left region 200' in FIG. 12A covering the fourth semiconductor fins 340 can be modified by reducing its size in the Y direction, while keeping the right region 200' in FIG. 12A covering the fifth semiconductor fins 350 unchanged. In this case, the left modified left region covers at least a region of the fourth semiconductor fins 340 for forming the second pull-down transistor PD2 but not a region of the fourth semiconductor fins 340 for forming the second pass-gate transistor PG2.

Figure 13A:
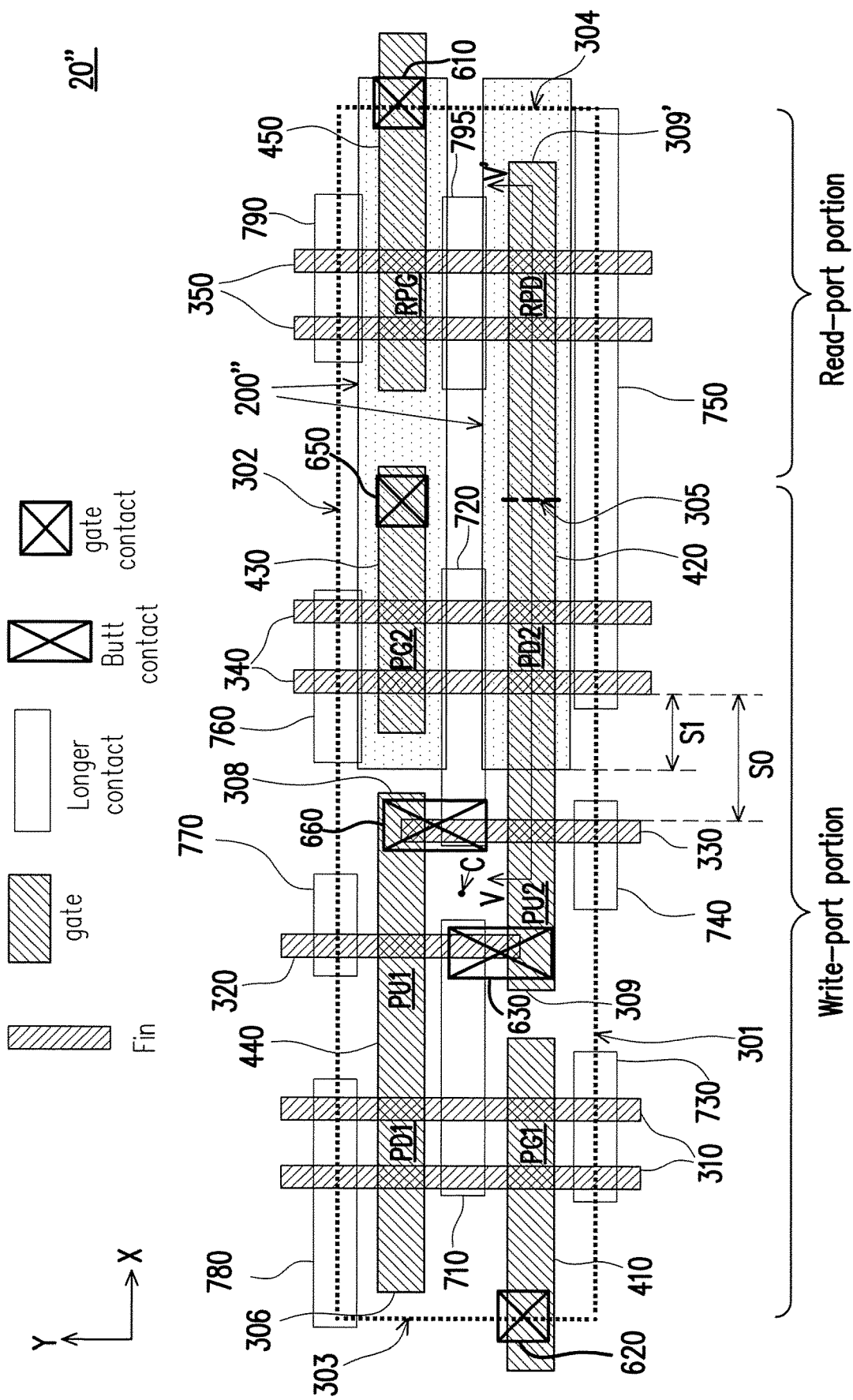
FIGS. 13A and 13B show another modified layout corresponding to the layouts shown in FIGS. 4 and 11, respectively.
Figure 13B:
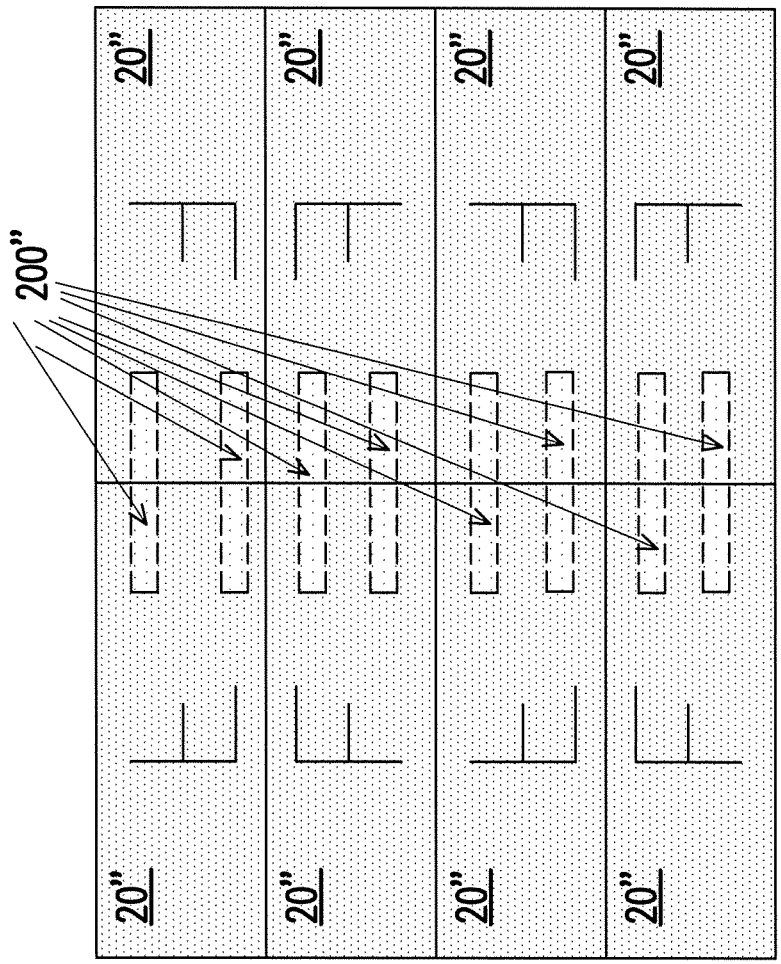

FIGS. 13A and 13B show another modified layout corresponding to the layouts shown in FIGS. 4 and 11, respectively.

Referring to FIGS. 13A and 13B, reference numeral 200" represents the regions to which the impurities are doped in the counter doping process. As compared to the region 200 shown in FIGS. 4 and 11, the region 200" in the layout 20" shown in FIG. 13A includes two discrete portions spaced apart from each other in the Y direction. Each of the two discrete portions covers the portions of the fourth and fifth semiconductor fins 340 and 350 corresponding to the channel regions of the respective transistors. As such, the impurities can be doped into the portions, such as portions the semiconductor fin regions corresponding to the channel regions, which can more effectively regulate the threshold voltages of the respective transistors.

Although not shown in the drawings, in other embodiments, each discrete portion 200" in FIG. 13A can be further modified to become two discrete portions spaced apart from each other in the X direction, based on the configuration of the two discrete portions 200' shown in FIG. 12A, while keeping the dimension in the Y direction unchanged.

Figure 14:
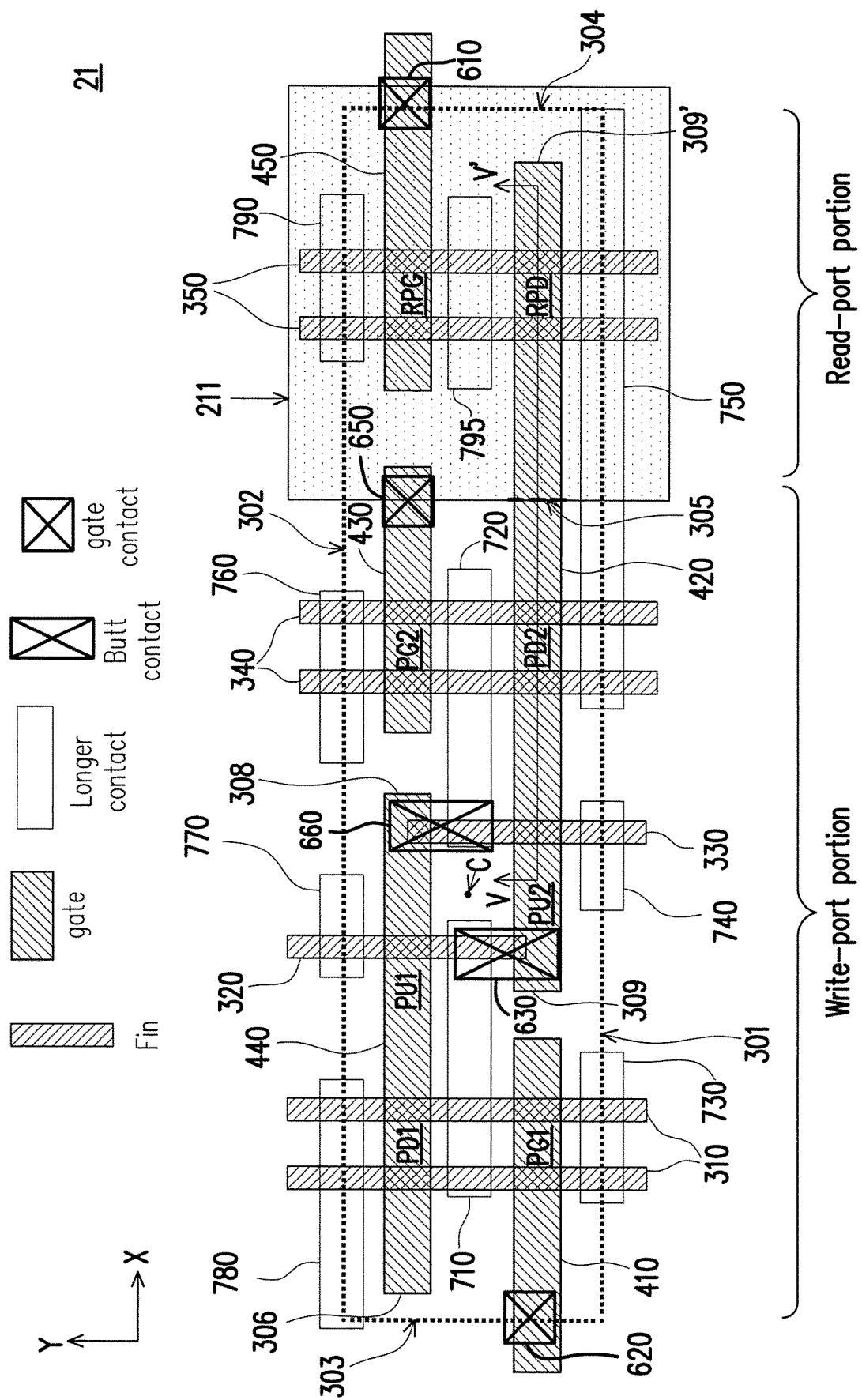
FIG. 14 shows a simplified layout of a comparative SRAM cell.

FIG. 14 shows a simplified layout of a comparative SRAM cell (hereinafter, "Comparative Example 1").

Referring to FIG. 14, the simplified layout 21 of Comparative Example 1 is substantially the same as the simplified layout 20 of the SRAM cell 10, except that a region 211, to which the dopants provided in the counter doping process are doped, does not cover the fourth semiconductor fins 340. One of ordinary skill in the art should understand that the layout of the remaining layers not shown in FIG. 14 can be the same as those shown in FIG. 3A. Such descriptions will be omitted to avoid redundancy.

Figure 15:
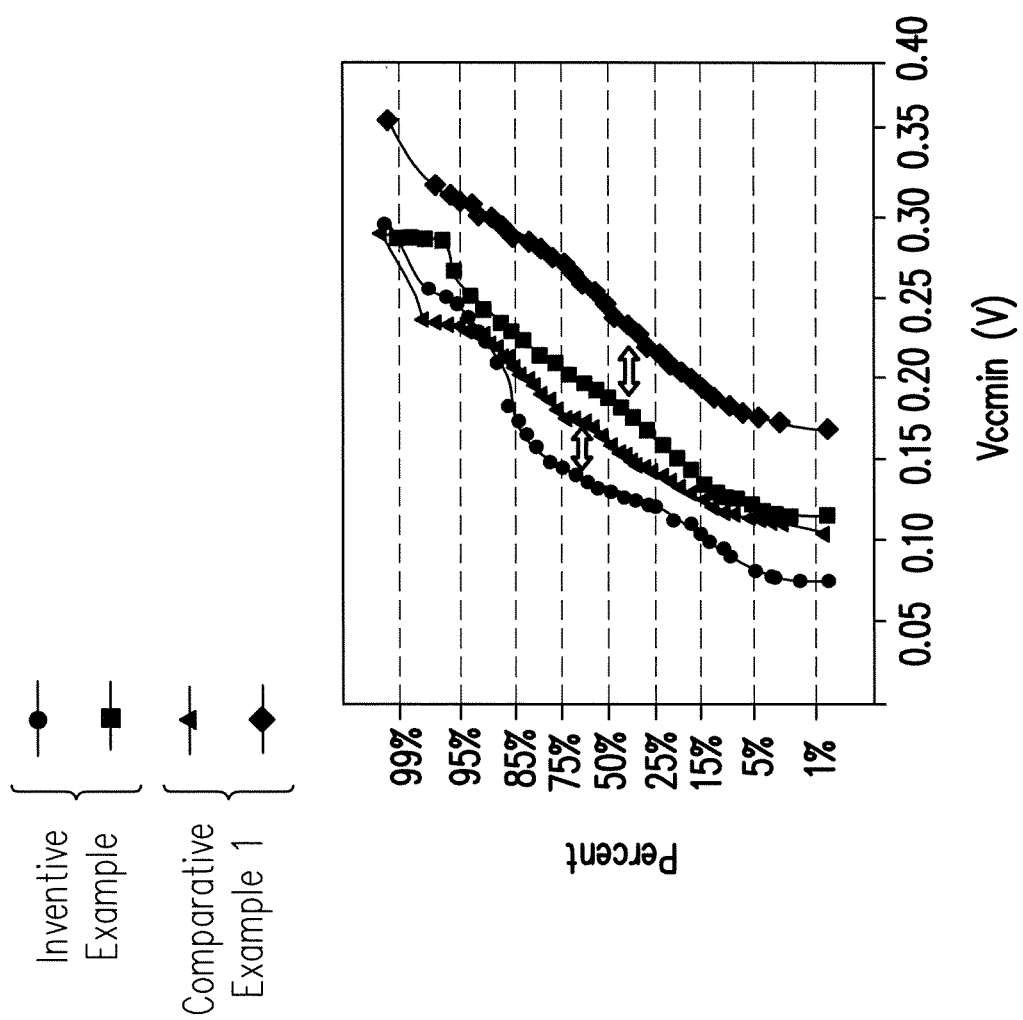
FIG. 15 shows performance comparison between an SRAM cell according to embodiments of the present disclosure and a comparative example.

FIG. 15 shows a significant reduction, for example, by 55 mV to 60 mV in Vccmin of the SRAM cell 10 (label as "Inventive Example") as compared to Vccmin of Comparative Example 1, when the threshold voltage of the second pull-down transistor PD2 and the threshold voltage of the first pull-down transistor PD1 of the SRAM cell 10 according to some embodiments are balanced. When the threshold voltage of the second pull-down transistor PD2 and the threshold voltage of the first pull-down transistor PD1 according to some embodiments are substantially equal to or close to each other with a difference within, for example, about 3%, as compared to a difference of 17% or higher in Comparative Example 1.

Comparative Example 2 is substantially the same as the simplified layout 20 of the SRAM cell 10, except that a region 200, to which the dopants provided in the counter doping process are doped, is omitted.

Figure 16:
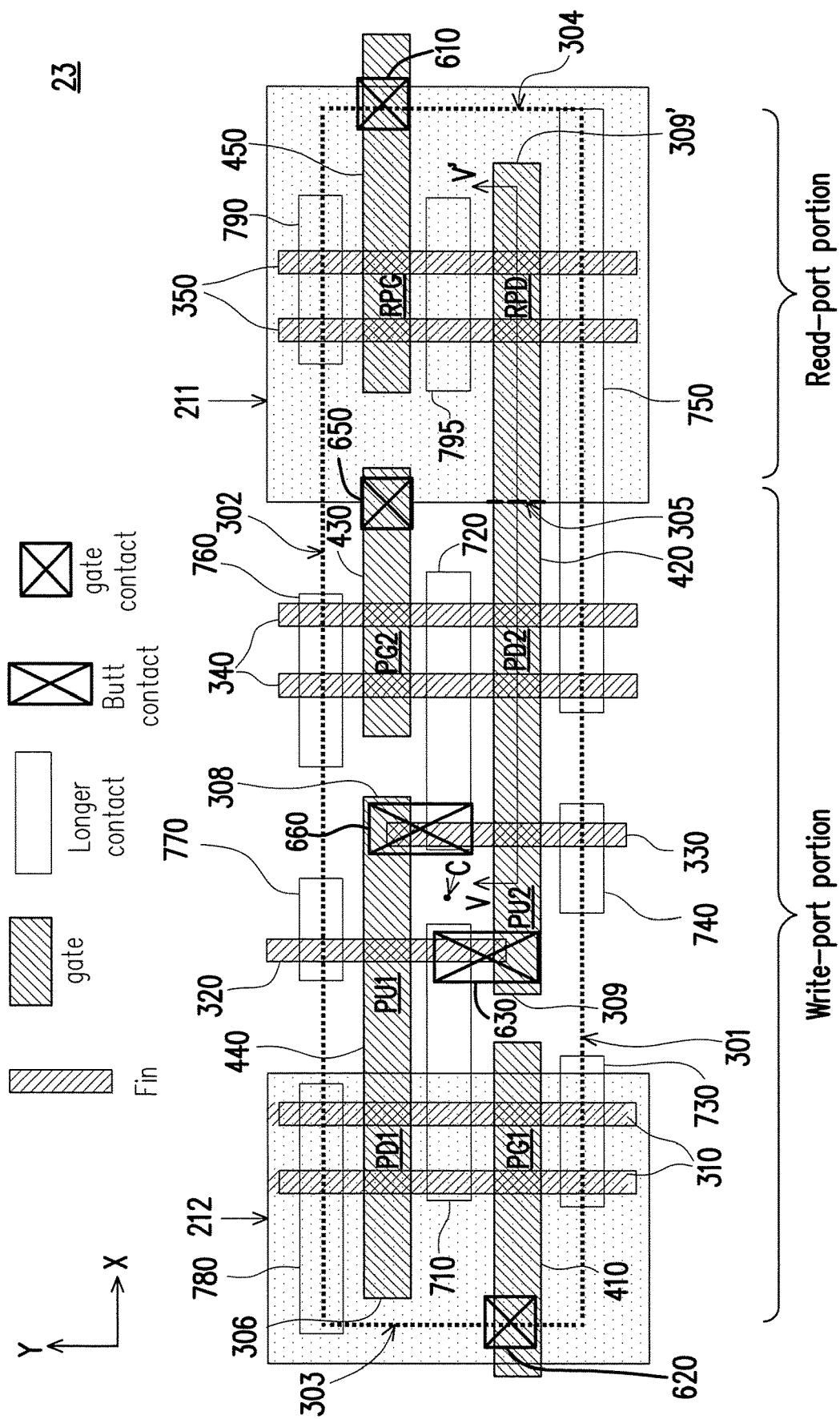
FIG. 16 shows a simplified layout of another comparative SRAM cell.

FIG. 16 shows a simplified layout of another comparative SRAM cell (hereinafter, "Comparative Example 3").

Referring to FIG. 16, the simplified layout 23 of Comparative Example 3 is substantially the same as the simplified layout 21 of Comparative Example 1 shown in FIG. 14, except that an additional region 212 covering the first semiconductor fins 310 is also doped in the counter doping process. One of ordinary skill in the art should understand that the layout of the remaining layers not shown in FIG. 16 can be the same as those shown in FIG. 3A. Such descriptions will be omitted to avoid redundancy.

Figure 17:
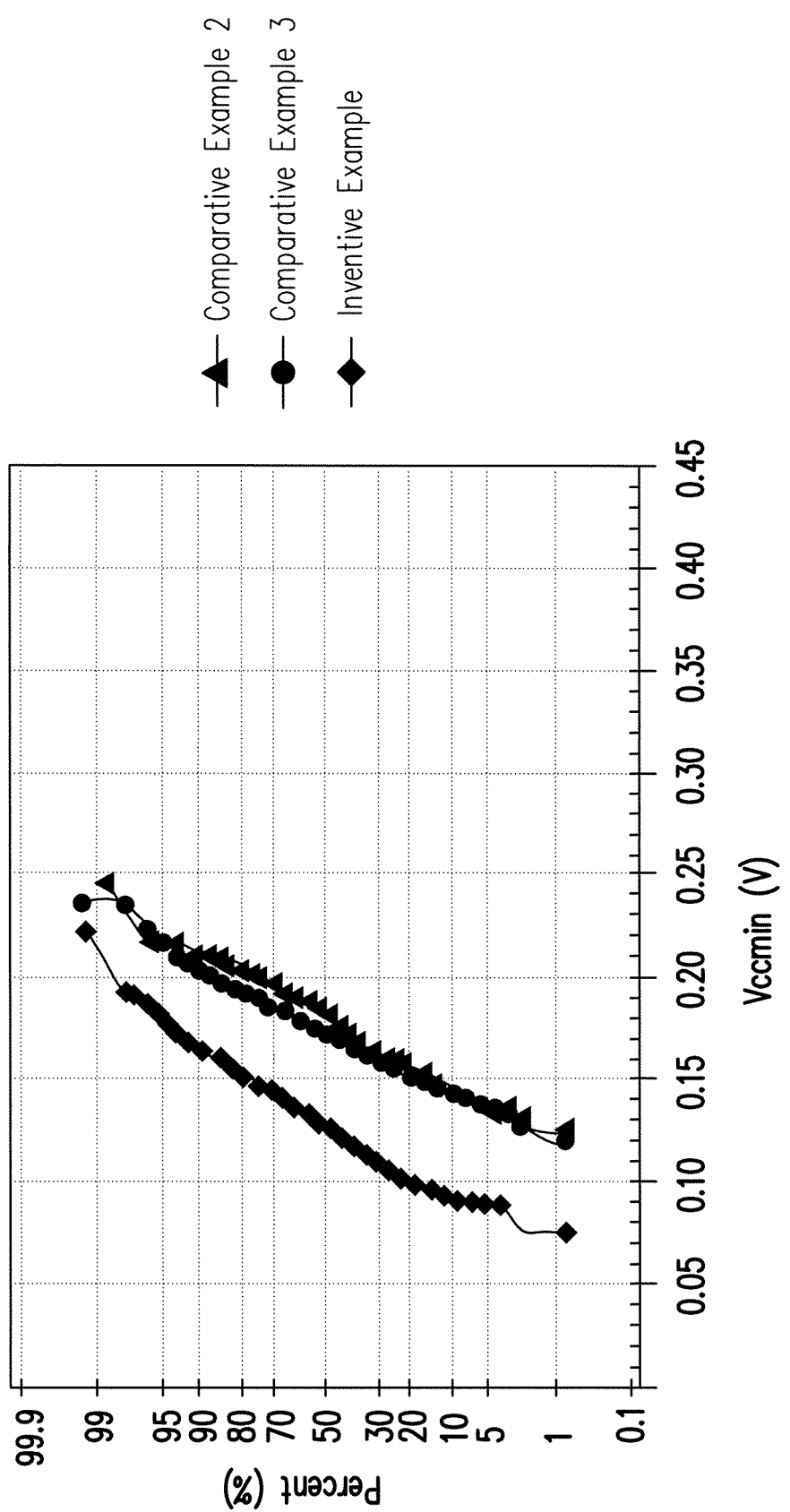
FIG. 17 shows performance comparison between an SRAM cell according to embodiments of the present disclosure and comparative examples.

FIG. 17 shows a significant reduction, for example, by 55 mV to 60 mV in Vccmin of the SRAM cell 10 (label as "Inventive Example") as compared to Vccmins of Comparative Example 2 and Comparative Example 3, when the threshold voltage of the second pull-down transistor PD2 and the threshold voltage of the first pull-down transistor PD1 of the SRAM cell 10 according to some embodiments are balanced. When the threshold voltage of the second pull-down transistor PD2 and the threshold voltage of the first pull-down transistor PD1 according to some embodiments are substantially equal to or close to each other with a difference within about, for example, 3%, as compared to a difference of 17% or higher in Comparative Examples 2 and 3.

Figure 18A:
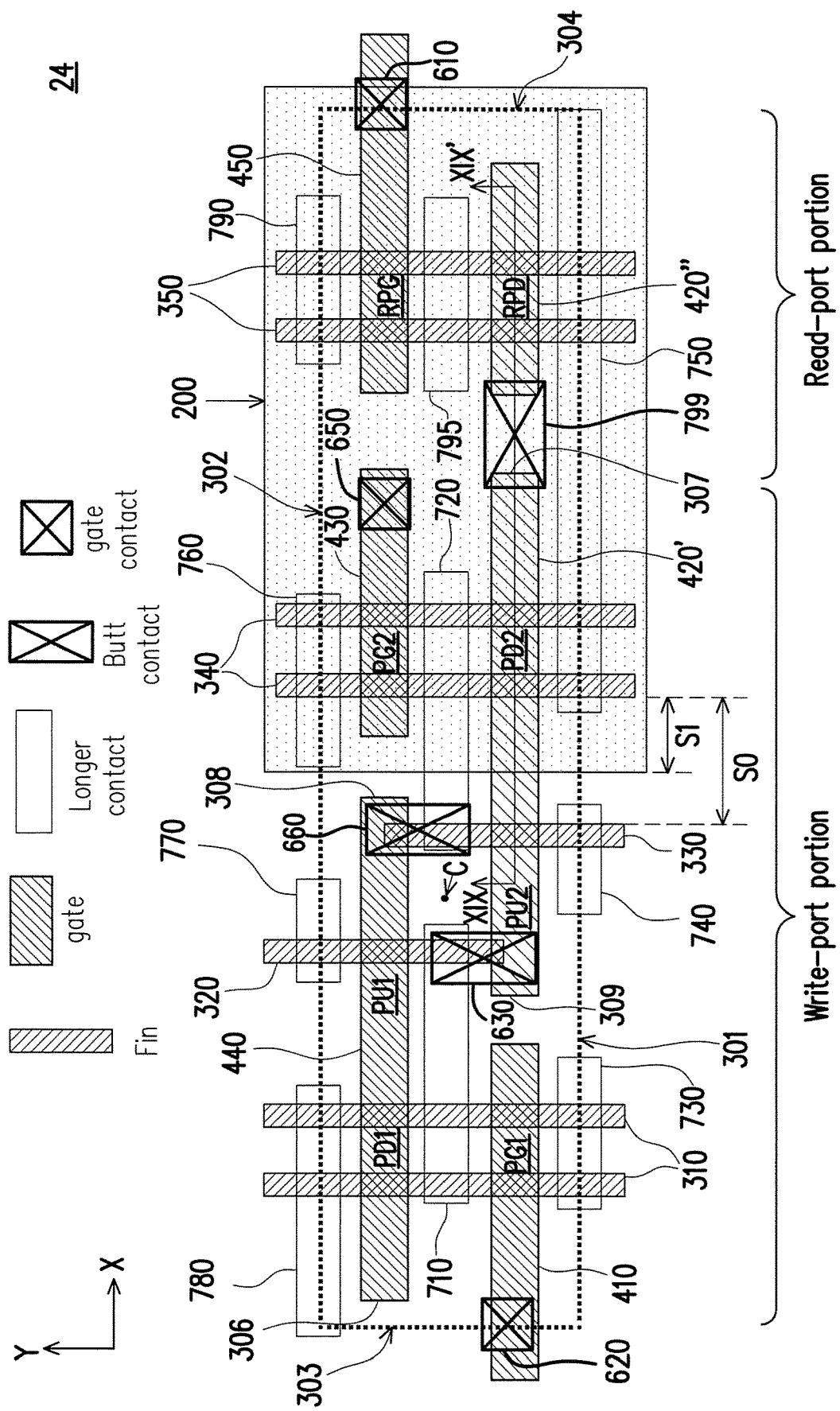
FIG. 18A shows a simplified layout of another SRAM cell according to embodiments of the present disclosure.
Figure 18B:
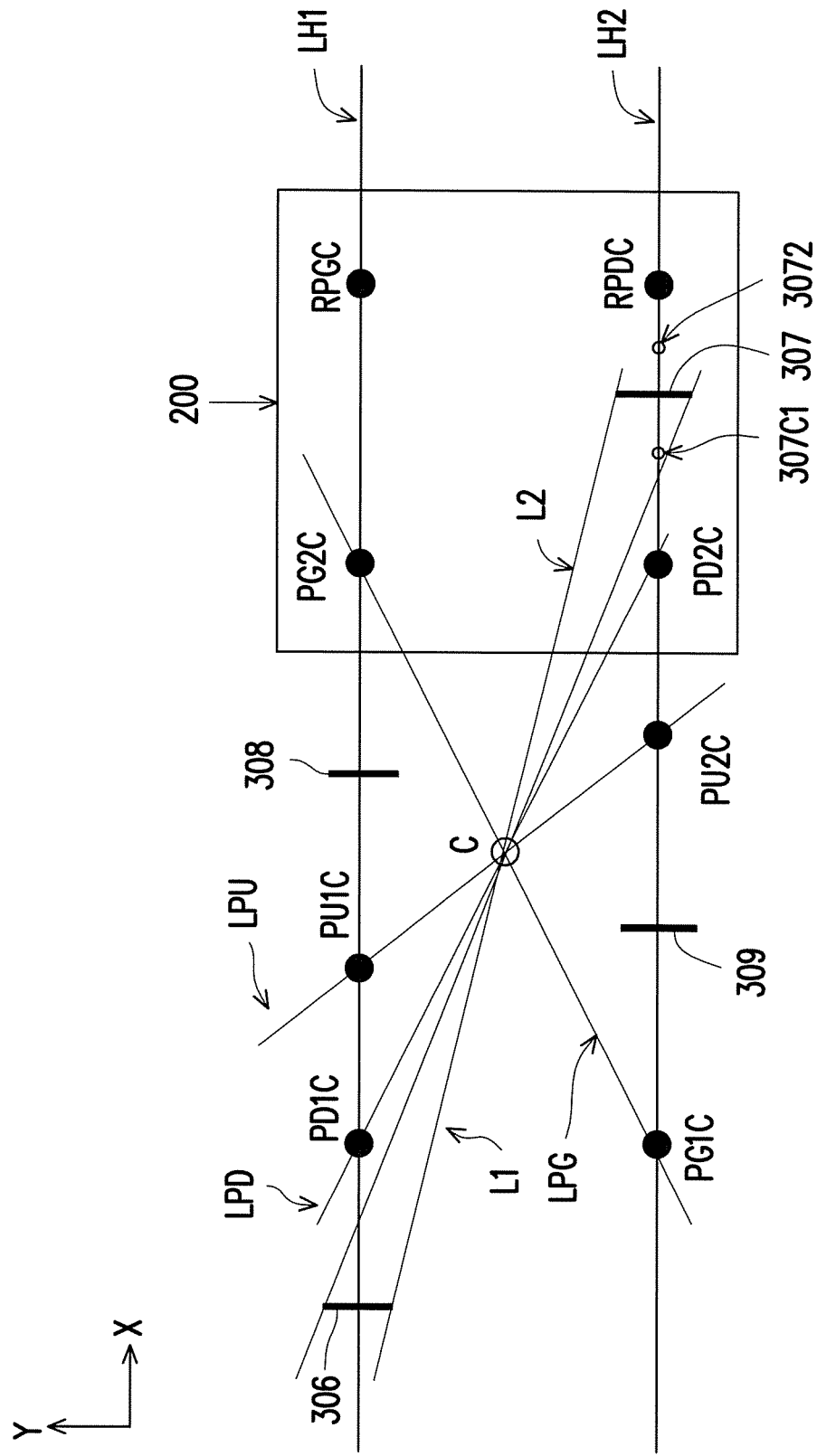
FIG. 18B illustrates relative locations of an end of a second gate electrode and an end of the fourth gate electrode with respect to geometric centers of the transistors of the write-port portion of the simplified layout shown in FIG. 18A.
Figure 19:
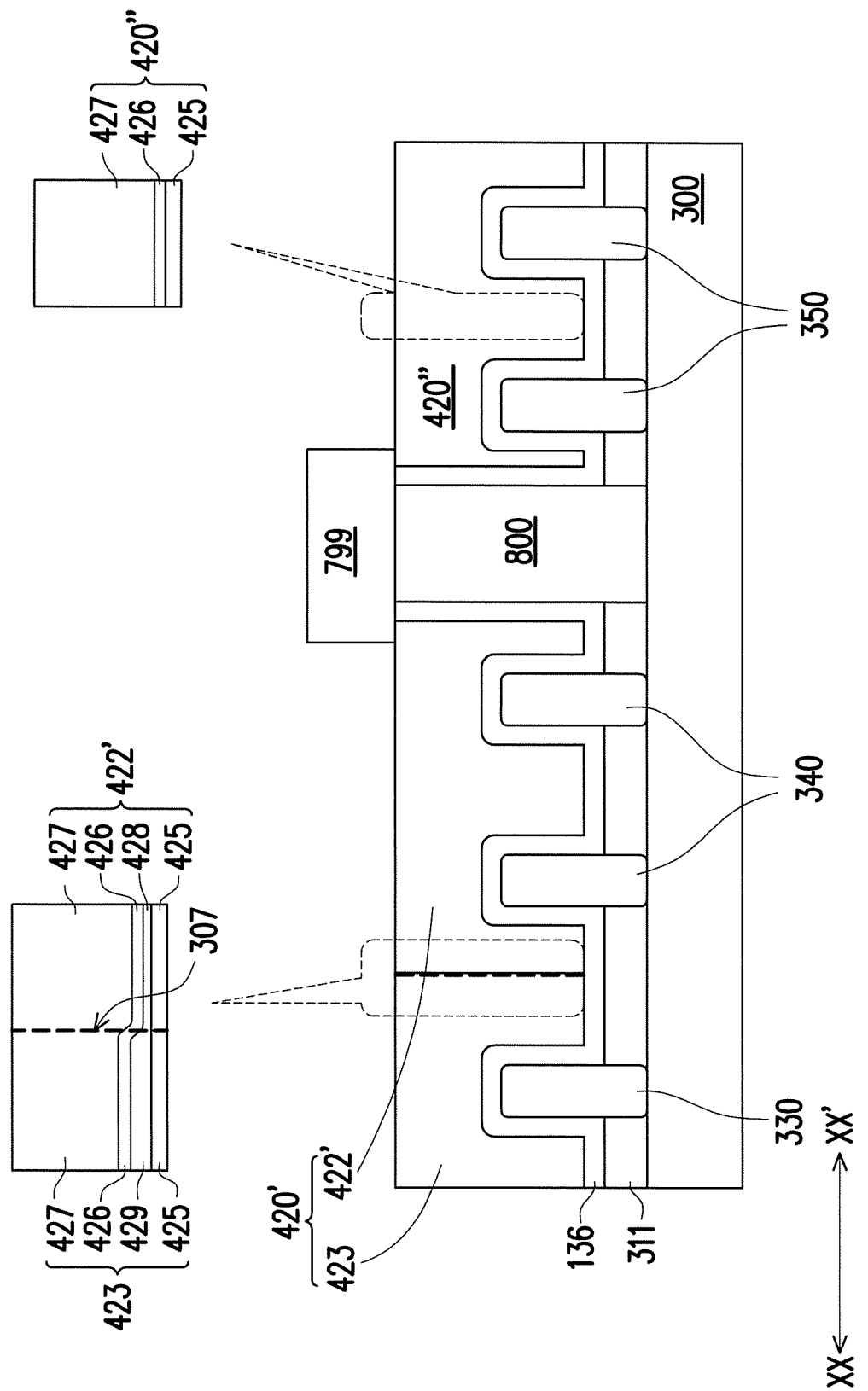
FIG. 19 illustrates a cross-sectional view taken along line XIX-XIX' in FIG. 18A.

FIG. 18A shows a simplified layout of another SRAM cell according to embodiments of the present disclosure. FIG. 18B illustrates relative locations of an end of a second gate electrode and an end of the fourth gate electrode with respect to geometric centers of the transistors of the write-port portion of the simplified layout shown in FIG. 18A. FIG. 19 illustrates a cross-sectional view taken along line XIX-XIX' in FIG. 18A.

The simplified layout 24 shown in FIG. 18A of another SRAM cell according to embodiments of the present disclosure is substantially the same as the simplified layout 20 shown in FIG. 4 of the memory cell 10. In the following descriptions, only the different portions in the simplified layout 24 will be described.

The second gate electrode layer 200 in the simplified layout 20 shown in FIG. 4 is replaced by first and second portions 420' and 420" spaced-apart from each other as shown in FIG. 19A.

Referring to FIGS. 18A and 19, the first portion 420' continuously extends from an end 307 to cover the channel regions of second pull-down transistor PD2 and the second pull-up transistor PU2. The second portion 420", aligned to the first portion 420' along the X direction, covers the channel region of read pull-down transistor RPD. The first and second portions 420' and 420" are separated from each other by a dielectric layer 800 made of, for example, $SiO_2$, $Si_3N_4$, SiON, or mixture thereof, and are electrically connected to each other by an interconnection layer 799 made by, for example, the gate contact layer. The interconnection layer 799 is disposed over the dielectric layer 800 to be in contact with the first portion 420' and second portion 420".

Referring to FIG. 19, the first portion 420' includes two sections 422' and 423 having the same or substantially the same vertical configurations as those of the second and third sections 422 and 423 shown in FIG. 5, and the second portion 420" has the same or substantially the same vertical configuration as that of the first sections 421 shown in FIG. 5. Overlapped descriptions will be omitted to avoid redundancy.

Now referring to FIGS. 18A and 18B, the end 306 of the fourth gate electrode layer 440 and the end 307 of the first portion 420' are disposed point symmetric with respect to the geometric center C, when the dielectric layer 799 and the interconnection layer 799 are introduced to replace the corresponding portion in the second gate electrode layer 420 in FIG. 4. Thus, performance of the memory cell can be further improved. The location of the end 307 of the first portion 420' should not be limited to. For example, the end 307 of the first portion 420' can be moved between the locations 307C1 and 307C2.

In some embodiments, the doping concentration of the impurities is about $1.5 \times 10^{13}/cm^3$ to about $2.5 \times 10^{13}/cm^3$. As compared to the example shown in FIG. 4, a relatively lower doped concentration is used, since replacing the corresponding portion in the second gate electrode layer 420 in FIG. 4 with the combined structure including the dielectric layer 799 and the interconnection layer 799 can mitigate the adverse effect of the asymmetric configuration of the second and fourth gate electrode layers 420 and 440 in FIG. 4. By counter doping the above exemplary impurities with the above doping concentration range into the read-port portion and also in the portion of the write-port portion immediately adjacent to the read-port portion, the difference of the threshold voltage of the second pull-down transistor PD2 and the threshold voltage of the first pull-down transistor PD1 is no more than, for example, 3%, and Vccmin, the minimum voltage at which the SRAM cell 10 will properly function, can be reduced, for example, by 55 mV to 60 mV. In some embodiments, the threshold voltage of the first pull-down transistor PD1 is slightly greater than that of the second pull-down transistor PD2.

On the other hand, if the doping concentration of the impurities is greater than about $2.5 \times 10^{13}/cm^3$, the SRAM cell 10 cannot properly function due to overdoped impurities in the regions for forming the channel regions of the respective transistors, and if the doping concentration of the impurities is less than about $1.5 \times 10^{13}/cm^3$, the threshold voltage of the second pull-down transistor PD2 can still be significantly lower than that of the first pull-down transistor PD1, impacting the performance of the SRAM cell.

In some embodiments, S1 and S0 satisfy $0.4 \leq S1/S0 \leq 0.6$. As compared to the example shown in FIG. 4, S1/S0 has a wider range, since replacing the corresponding portion in the second gate electrode layer 420 in FIG. 4 with the combined structure including dielectric layer 799 and the interconnection layer 799 can mitigate the adverse effect of the asymmetric configuration of the second and fourth gate electrode layers 420 and 440 in FIG. 4. As such, the threshold voltage of the second pull-down transistor PD2 and the threshold voltage of the second pull-up transistor PU2 can be secured. On the other hand, if the S1/S0 is less than 0.4, the threshold voltage of the second pull-down transistor PD2 cannot be effectively regulated to be substantially equal to or significantly close to that of the first pull-down transistor PD1, and if the S1/S0 is greater than 0.6, the threshold voltage of the second pull-up transistor PU2 can be affected to be not substantially equal to that of the first pull-up transistor PU1.

Figure 20:
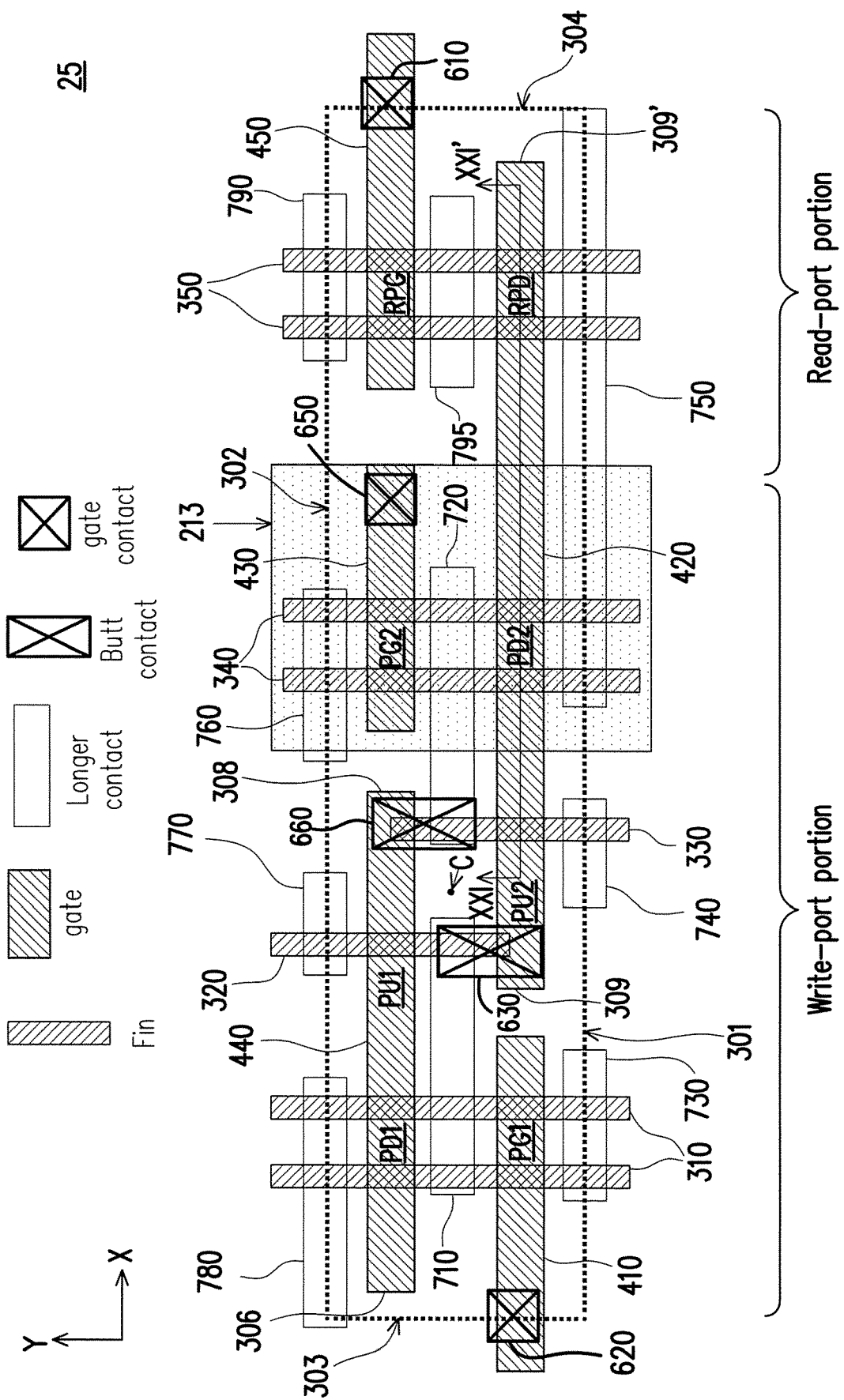
FIG. 20 shows a simplified layout of another SRAM cell according to embodiments of the present disclosure.
Figure 21:
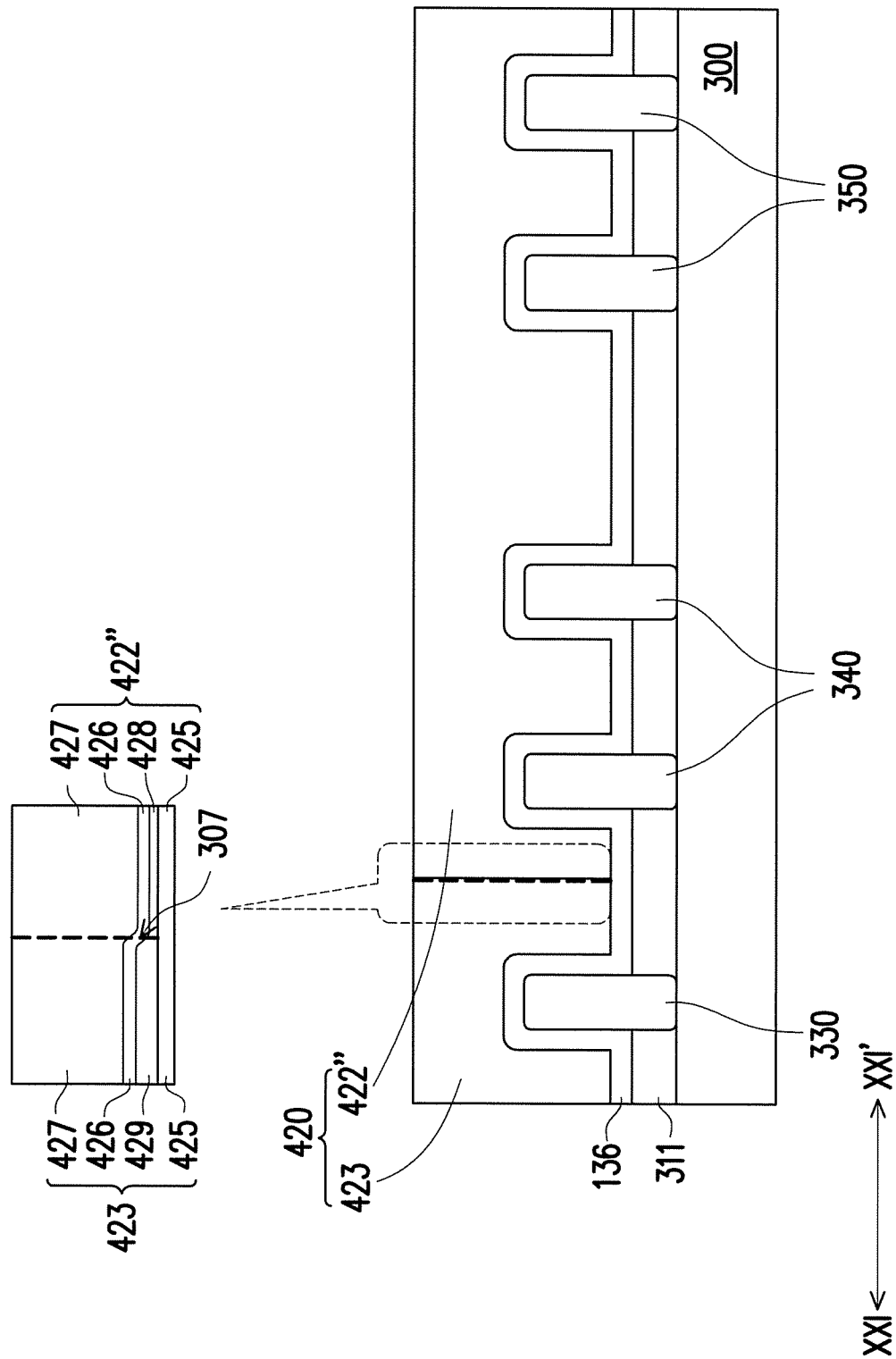
FIG. 21 illustrates a cross-sectional view taken along line XXI-XXI' in FIG. 20.

FIG. 20 shows a simplified layout of another SRAM cell according to embodiments of the present disclosure. FIG. 21 illustrates a cross-sectional view taken along line XXI-XXI' in FIG. 20.

The simplified layout 25 shown in FIG. 20 of another SRAM cell according to embodiments of the present disclosure is substantially the same as the simplified layout 20 shown in FIG. 4 of the memory cell 10. In the following descriptions, only the different portions in the simplified layout 25 will be described.

Instead of forming the read pull-down transistor PRD and the read pass-gate transistor RPG as LVT devices or ULVT devices as shown in FIGS. 4 and 5, the read pull-down transistor PRD and the read pass-gate transistor RPG, together with the other N-type devices including the first and second pass-gate transistors PG1 and PG2 and the first and second pull-down transistors PD1 and PD2, are formed as SVT devices.

Thus, as shown in FIG. 21, the second gate electrode layer 220 includes one continuous portion 422' having the same material composition in X direction as that of the second section 422 shown in FIG. 5, and the first section 421 shown in FIG. 5 is omitted in the example shown in FIG. 21.

In other embodiments, only the read-pass-gate transistor RPG among all of the N-type transistors is an LVT device or ULVT device and the remaining transistors are SVT devices. In this case, the vertical configuration of the fifth gate electrode layer 450 can be the same as that of the first section 421 shown in FIG. 5.

Due to the above modification, a region 213, to which the dopants provided in the counter doping process are doped, is different from the region 200 shown in FIG. 4. One of ordinary skill in the art should understand that, during the counter doping process, only the region 213 is counter doped with impurities (dopants) provided in the counter doping process while the remaining region of the SRAM cell is not doped with the impurities provided in the counter doping process. As such, the threshold voltage of the second pull-down transistor PD2 is increased to a level close to or substantially equal to that of the first pull-down transistor PD1, thereby reducing the difference in the threshold voltages of the first and second pull-down transistors PD1 and PD2 so as to mitigate or minimize the adverse effect caused by the asymmetric configuration of the second and fourth gate electrode layers 420 and 440.

In some embodiments, the doping concentration of the impurities is about $1.5 \times 10^{13}/cm^3$ to about $2.5 \times 10^{13}/cm^3$. As compared to the example shown in FIG. 4, a relatively lower doping concentration is used, since one or more of the read pull-down transistor RPD and the read pass-gate transistor shown in FIG. 21 are modified to be SVT devices. By counter doping the above exemplary impurity with the above doping concentration range into the read-port portion and also in the portion of the write-port portion immediately adjacent to the read-port portion, the difference of the threshold voltage of the second pull-down transistor PD2 and the threshold voltage of the first pull-down transistor PD1 is no more than, for example, 3%, and Vccmin, the minimum voltage at which the SRAM cell 10 will properly function, can be reduced, for example, by 55 mV to 60 mV. In some embodiments, the threshold voltage of the first pull-down transistor PD1 is slightly greater than that of the second pull-down transistor PD2.

On the other hand, if the doping concentration of the impurities is greater than about $2.5 \times 10^{13}/cm^3$, the SRAM cell 10 cannot properly function due to overdoped impurities in the regions for forming the channel regions of the respective transistors, and if the doping concentration of the impurities is less than about $1.5 \times 10^{13}/cm^3$, the threshold voltage of the second pull-down transistor PD2 can still be significantly lower than that of the first pull-down transistor PD1, impacting the performance of the SRAM cell.

The above described embodiments are directed to SRAM cells including a plurality of FinFETs. The present disclosure is not limited thereto. According to other embodiments, the SRAM cells can be implemented by planner transistors or gate-all-around transistors. According to other embodiments, the regulating of the threshold voltage can be implemented to any other devices, in addition to SRAM cells.

According to some aspects, performance of eight-transistor SRAM cells or SRAM memory array/device, or any other circuits can be improved by compensating asymmetric or unbalanced threshold voltages of transistors thereof.

According to some aspects, a read pull-down transistor and a read pass-gate transistor of an eight-transistor SRAM cell can have a relatively lower threshold voltage, as compared to other transistors of the SRAM cell, such that the operation speed of the SRAM cell can be increased. According to some aspects, a difference in threshold voltages of pull-down transistors in a write-portion of the SRAM cell can be reduced by a counter doping process selectively performed to some region in the SRAM cell.

According to some aspects, an implantation mask is used to define a counter doped region to raise a threshold voltage of a second pull-down transistor. According to some aspects, the implantation mask covers at least a region for forming the second pull-down transistor and the read pull-down transistor, such that metal boundary effect caused by metal junction between gate electrodes of the second pull-down transistor and the read pull-down transistor can be compensated. According to some aspects, the implantation using the implantation mask can reduce a difference in threshold voltages of the first and second pull-down transistors from 17% to 3%, thereby achieving balanced device performance.

According to some aspects, Vccmin, the minimum voltage at which the SRAM cell can functionally operate, can be reduced by about 55 mV to about 60 mV.

According to some aspects, improvement in Vccmin by about 55 mV to about 60 mV can be achieved, as compared to an example without incorporating features of the present disclosure.

In an embodiment, a Static Random Access Memory (SRAM) cell includes a write port including a first inverter including a first pull-up transistor and a first pull-down transistor, and a second inverter including a second pull-up transistor and a second pull-down transistor and cross-coupled with the first inverter; and a read port including a read pass-gate transistor and a read pull-down transistor serially connected to each, gate electrodes of the read pass-gate transistor, the second pull-down transistor, and the second pull-up transistors being electrically connected to each other. A first doping concentration of impurities doped in channel regions of the second pull-down transistor and the read pull-down transistor is greater than a second doping concentration of the impurities doped in a channel region of the first pull-down transistor, or the impurities are doped in the channel regions of the second pull-down transistor and the read pull-down transistor and are not doped in the channel region of the first pull-down transistor. In an embodiment, the first and second pass-gate transistors, the first and second pull-down transistors, the read pass-gate transistor, and the read pull-down transistors are first type transistors, the first and second pull-down transistors are second type transistors, and the impurities are a second type dopant. In an embodiment, the SRAM cell further includes first through fifth semiconductor fins sequentially arranged and spaced-apart from each other along a first direction, the first pull-down transistor and the first pass-gate transistor are constituted by the first semiconductor fin, the first pull-up transistor is constituted by the second semiconductor fin, the second pull-up transistor based on made of the third semiconductor fin, the second pass-gate transistor and the second pull-down transistor are constituted by the fourth semiconductor fin, and the read pull-down transistor and the read pass-gate transistor are constituted by the fifth semiconductor fin, and the impurities are doped in upper portions of the fourth and fifth semiconductor fins. In an embodiment, a threshold voltage in an absolute value of the second pull-down transistor is greater than that of the read pull-down transistor and less than that of the first pull-down transistor. In an embodiment, the SRAM cell of further includes a gate electrode layer extending continuously to cover the channel regions of the read pull-down transistor, the second pull-down transistor, and the second pull-up transistor, the gate electrode layer includes a first section covering at least the channel region of the read pull-down transistor, a second section covering at least the channel region of the second pull-down transistor, and a third section covering at least the channel region of the second pull-up transistor, the gate electrodes of the read pull-down transistor, the second pull-down transistor, the second pull-up transistor constitute a portion or an entity of the gate electrode layer, and a work function level of the first section is lower than that of the second section. In an embodiment, the first doping concentration is about $3×10^{13}/cm^3$ to about $3.5×10^{13}/cm^3$. In an embodiment, the first and second sections have a metal junction. In an embodiment, a channel region of the read pass-gate transistor is doped with the impurities having a third doping concentration substantially the same as the first doping concentration. In an embodiment, a difference of a threshold voltage of the second pull-down transistor and a threshold voltage in an absolute value of the first pull-down transistor is no more than 3%. In an embodiment, the SRAM cell further includes a first gate electrode layer covering a channel of the read pull-down transistor, and a second gate electrode layer extending continuously to cover the channel regions of the second pull-up transistor and the second pull-down transistor, the first and second gate electrodes are separated from each other by a dielectric layer filling a space therebetween, and are electrically connected to each other by an interconnection layer disposed on the first gate electrode layer, the dielectric layer, and the second gate electrode layer, the second gate electrode layer includes a first section covering at least the channel region of the second pull-down transistor and a second section covering at least the channel region of the second pull-up transistor, the gate electrode of the read pull-down transistor constitutes a portion or an entity of the first gate electrode layer, and the gate electrodes of the second pull-down transistor and the second pull-up transistor constitute a portion or an entity of the second gate electrode layer, and a work function level of the first electrode layer is lower than that of the first section of the second gate electrode layer. In an embodiment, the first doping concentration is about $1.5×10^{13}/cm^3$ to about $2.5×10^{13}/cm^3$.

In an embodiment, a Static Random Access Memory (SRAM) cell includes a write port including a first inverter including a first pull-up transistor and a first pull-down transistor, and a second inverter including a second pull-up transistor and a second pull-down transistor and cross-coupled with the first inverter, and a read port including a read pass-gate transistor and a read pull-down transistor serially connected to each, gate electrodes of the read pass-gate transistor, the second pull-down transistor, and the second pull-up transistors being electrically connected to each other. A first doping concentration of impurities doped in a channel region of the second pull-down transistor is greater than a second doping concentration of the impurities doped in a channel region of the first pull-down transistor and a third doping concentration of the impurities doped in a channel region of the read pull-down transistor, or the impurities are doped in the channel regions of the second pull-down transistor and are not doped in the channel regions of the first pull-down transistor and the read pull-down transistor. In an embodiment, a threshold voltage in an absolute value of the read pull-down transistor is greater than that of the read pass-gate transistor. In an embodiment, the SRAM cell further includes a gate electrode layer extending continuously to cover the channel regions of the read pull-down transistor, the second pull-down transistor, and the second pull-up transistor, the gate electrode layer includes a first section covering at least the channel regions of the read pull-down transistor and the second pull-down transistor, and a second section covering at least the channel region of the second pull-up transistor, the gate electrodes of the read pull-down transistor, the second pull-down transistor, and the second pull-up transistor constitute a portion or an entity of the gate electrode layer, and a work function level of the first section is substantially the same as along an extending direction of the gate electrode layer. In an embodiment, the first doped concentration is about $1.5\times10^{13}/cm^3$ to about $2.5\times10^{13}/cm^3$.

In an embodiment, a semiconductor device includes first and second transistors arranged along a first direction in an order of the first transistor and the second transistor on a first path, third through fifth transistors sequentially arranged along the first direction on a second path, the second path being spaced apart from the first path in a second direction perpendicular to the first direction; a first gate electrode layer continuously extending from a first end thereof to a second end thereof along the first direction, and covering channel regions of the first and second transistors; and a second gate electrode layer continuously extending from a third end thereof to a fourth end thereof along the first direction, and covering at least channel regions of the third and fourth transistors, gate electrodes of the third through fifth transistors being electrically connected to each other, and the gate electrodes of the third and fourth transistors constituting a portion or an entirety of the second gate electrode layer. In an embodiment, the first, fourth, and fifth transistors are first type transistors, and the second and fourth transistors are second type transistors, the second end of the first gate electrode layer and the third end of the second gate electrode layer are point symmetric with respect to a geometric center of the first through fourth transistors, and a first doping concentration of a second type impurity doped in the channel regions of the fourth and fifth transistors is greater than a second doping concentration of the second type impurity doped in the channel region of the first transistor, or the second type impurity is doped in the channel regions of the fourth and fifth transistors and is not doped in the channel region of the first transistor. In an embodiment, the second gate electrode layer continuously extends from the third end thereof to the fourth end thereof along the first direction, and includes first through third sections respectively covering at least channel regions of the third through fifth transistors, the gate electrodes of the third through fifth transistors constituting a portion or an entirety of the second gate electrode layer, the first end of the first gate electrode layer and the fourth end of the second gate electrode layer are point asymmetric with respect to the geometric center of the first through fourth transistors, and a work function level of the second section is higher than that of the third section. In an embodiment, the first doping concentration is about $3\times10^{13}/cm^3$ to about $3.5\times10^{13}/cm^3$. In an embodiment, the semiconductor device further includes a third gate electrode layer covering at least the channel region of the fifth transistor, separated from the second gate electrode layer by a dielectric layer, and electrically connected to the second gate electrode layer by an interconnection layer disposed on the second and third gate electrode layers and the dielectric layer, the gate electrode of the fifth transistor constitutes a portion or an entirety of the third gate electrode layer, and a work function level of the third gate electrode layer is lower than a portion of the second gate electrode layer that is in contact with the interconnection layer. In an embodiment, the first doping concentration is about $1.5\times10^{13}/cm^3$ to about $2.5\times10^{13}/cm^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plurality of fins extending in a first direction and arranged along a second direction, wherein the second direction is substantially perpendicular to the first direction;
    a first plurality of gate electrode layers disposed over one or more fins of the plurality of fins, wherein each of the first plurality of gate electrode layers are spaced apart from each other and extend in the second direction along a first line; and
    a second plurality of gate electrode layers disposed over one or more fins of the plurality of fins, wherein each of the second plurality of gate electrode layers are spaced apart from each other and extend in the second direction along a second line, and the second line is substantially parallel to the first line,
    wherein the first plurality and second plurality of gate electrode layers are disposed over channel regions of the plurality of fins,
    a first gate electrode layer of the first plurality of gate electrode layers is disposed over a first fin and a second fin of the plurality of fins,
    a second gate electrode layer of the second plurality of gate electrode layers is disposed over a third fin and a fourth fin of the plurality of fins,
    the first fin, second fin, third fin, and fourth fin of the plurality of fins are different fins,
    the first fin of the plurality of fins includes a first channel region having a first doping concentration below the first gate electrode layer of the first plurality of gate electrode layers,
    the second fin of the plurality of fins includes a second channel region having a second doping concentration below the first gate electrode layer of the first plurality of gate electrode layers,
    the third fin of the plurality of fins includes a third channel region having a third doping concentration below the second gate electrode layer of the second plurality of gate electrode layers,
    the fourth fin of the plurality of fins includes a fourth channel region having a fourth doping concentration below the fourth gate electrode layer of the second plurality of gate electrode layers, and
    the first doping concentration and second doping concentration are each greater than the third doping concentration.

2. The semiconductor device of claim 1, wherein the first gate electrode layer of the first plurality of gate electrode layers, is disposed over the fourth fin of the plurality of fins.

3. The semiconductor device of claim 2, wherein the first gate electrode layer of the first plurality of gate electrode layers, is disposed over a fifth fin of the plurality of fins, wherein the fifth fin of the plurality of fins is between the first fin of the plurality of fins and the fourth fin of the plurality of fins.

4. The semiconductor device of claim 1, wherein the first plurality of gate electrode layers further comprises a third gate electrode layer, wherein the third gate electrode layer is disposed over the third fin of the plurality of fins.

5. The semiconductor device of claim 1, wherein the second plurality of gate electrode layers further comprises a fourth gate electrode layer, wherein the fourth gate electrode layer is disposed over the first fin of the plurality of fins.

6. The semiconductor device of claim 1, wherein the second plurality of gate electrode layers further comprises a fifth gate electrode layer, wherein the fifth gate electrode layer is disposed over the second fin of the plurality of fins.

7. The semiconductor device of claim 1, further comprising a sixth fin of the plurality of fins extending in the first direction adjacent the first fin of the plurality of fins, wherein the first gate electrode layer of the first plurality of gate electrode layers is disposed over the sixth fin of the plurality of fins.

8. The semiconductor device of claim 1, further comprising a seventh fin of the plurality of fins extending in the first direction adjacent the second fin of the plurality of fins, wherein the first gate electrode layer of the first plurality of get electrode layers is disposed over the seventh fin of the plurality of fins.

9. The semiconductor device of claim 1, further comprising an eighth fin of the plurality of fins extending in the first direction adjacent the third fin of the plurality of fins, wherein the second gate electrode layer of the second plurality of gate electrode layers is disposed over the eighth fin of the plurality of fins.

10. A semiconductor device, comprising:
a plurality of fins extending in a first direction and arranged along a second direction, wherein the second direction is substantially perpendicular to the first direction;
a first plurality of gate electrode layers disposed over one or more fins of the plurality of fins, wherein each of the first plurality of gate electrode layers are spaced apart from each other and extend in the second direction along a first line; and
a second plurality of gate electrode layers disposed over one or more fins of the plurality of fins, wherein each of the second plurality of gate electrode layers are spaced apart from each other and extend in the second direction along a second line, and the second line is substantially parallel to the first line,
wherein the first plurality of gate electrode layers and second plurality of gate electrode layers are disposed over channel regions of the plurality of fins,
a first gate electrode layer of the first plurality of gate electrode layers is disposed over a first fin, a second fin, and a third fin of the plurality of fins,
the first gate electrode layer includes a first section disposed over the first fin of the plurality of fins, a second section disposed over the second fin of the plurality of fins, and a third section disposed over the third fin of the plurality of fins,
each of the first section, second section, and third section includes one or more work function adjustment layers, and
the number of work function adjustment layers, the thickness of one or more work function adjustment layers, or the material of the one or more work function adjustment layers is different in each of the first section, second section, and third section.

11. The semiconductor device of claim 10, further comprising a gate dielectric layer disposed between the one or more work function adjustment layers and the first fin, second fin, and third fin of the plurality of fins.

12. The semiconductor device of claim 10, wherein the first plurality of gate electrode layers comprises a second gate electrode layer disposed over a fourth fin of the plurality of fins extending in the first direction.

13. The semiconductor device of claim 10, wherein the second plurality of gate electrode layers comprises a third gate electrode layer disposed over the fourth fin and the first fin of the plurality of fins.

14. The semiconductor device of claim 10, wherein the second plurality of gate electrode layers comprises a fourth gate electrode layer disposed over the second fin of the plurality of fins.

15. The semiconductor device of claim 10, wherein the second plurality of gate electrode layers comprises a fifth gate electrode layer disposed over the third fin of the plurality of fins.

16. A semiconductor device, comprising:
a substrate including a counter doped region and a remaining region not counter doped;
a plurality of fins disposed over the substrate extending in a first direction and arranged along a second direction, wherein the second direction is substantially perpendicular to the first direction;
a first plurality of gate electrode layers disposed over one or more fins of the plurality of fins, wherein each of the first plurality of gate electrode layers are spaced apart from each other and extend in the second direction along a first line; and
a second plurality of gate electrode layers disposed over one or more fins of the plurality of fins, wherein each of the second plurality of gate electrode layers are spaced apart from each other and extend in the second direction along a second line, and the second line is substantially parallel to the first line,
wherein the first plurality of gate electrode layers and second plurality of gate electrode layers are disposed over channel regions of the plurality of fins,
a first gate electrode layer of the first plurality of gate electrode layers is disposed over a first fin, a second fin, and a third fin of the plurality of fins,
the first fin of the plurality of fins is disposed over the remaining region of the substrate that is not counter doped,
the second fin and third fin of the plurality of fins are disposed over the counter doped region of the substrate,
a distance along the second direction between the first fin of the plurality of fins and the second fin of the plurality of fins is S0,
a distance along the second direction between the second fin of the plurality of fins and an adjacent boundary of the counter doped region of the substrate is S1, and
S0 and S1 satisfy $0.4 \leq S1/S0 \leq 0.5$.

17. The semiconductor device of claim 16, further comprising a fourth fin of the plurality of fins extending in the first direction and disposed over the remaining region of the substrate that is not counter doped, wherein the first gate electrode layer is disposed over the fourth fin of the plurality of fins.

18. The semiconductor device of claim 16, wherein the first plurality of gate electrode layers comprises a second gate electrode layer disposed over a fifth fin of the plurality of fins extending in the first direction and disposed over the remaining region of the substrate that is not counter doped.

19. The semiconductor device of claim 18, wherein the second plurality of gate electrode layers comprises a third gate electrode layer disposed over the first fin and the fifth fin of the plurality of fins.

20. The semiconductor device of claim 16, wherein the second plurality of gate electrode layers comprises a fourth gate electrode layer disposed over the second fin of the plurality of fins.

* * * * *